United States Patent
Lee et al.

(10) Patent No.: US 8,455,889 B2
(45) Date of Patent: Jun. 4, 2013

(54) LEAD FRAME FOR CHIP PACKAGE, CHIP PACKAGE, PACKAGE MODULE, AND ILLUMINATION APPARATUS INCLUDING CHIP PACKAGE MODULE

(75) Inventors: Young-jin Lee, Seoul (KR);
Jeong-wook Lee, Gyeonggi-do (KR);
Kyung-mi Moon, Gyeonggi-do (KR);
Young-hee Song, Gyeonggi-do (KR);
Ill-heung Choi, Gyeonddi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 217 days.

(21) Appl. No.: 13/102,586

(22) Filed: May 6, 2011

(65) Prior Publication Data
US 2011/0272716 A1 Nov. 10, 2011

(30) Foreign Application Priority Data
May 7, 2010 (KR) .......................... 10-2010-0043171

(51) Int. Cl.
*H01L 29/18* (2006.01)
(52) U.S. Cl.
USPC ................... 257/88; 257/48; 257/89; 257/98; 257/99; 257/100; 438/26; 438/29

(58) Field of Classification Search
None
See application file for complete search history.

(56) References Cited

U.S. PATENT DOCUMENTS
8,030,762 B2 * 10/2011 Lee et al. ...................... 257/717

FOREIGN PATENT DOCUMENTS
| | | |
|---|---|---|
| JP | 2006-186197 | 7/2006 |
| JP | 2007-036073 | 2/2007 |
| KR | 10-2002-0020049 | 3/2002 |
| KR | 10-2009-0019510 | 2/2009 |
| KR | 10-2010-0012170 | 2/2010 |
| KR | 10-2010-0015422 | 2/2010 |
| KR | 10-2010-0018259 | 2/2010 |

* cited by examiner

*Primary Examiner* — Kyoung Lee
(74) *Attorney, Agent, or Firm* — McDermott Will & Emery LLP

(57) ABSTRACT

A lead frame for a chip package, a chip package, a package module, and an illumination apparatus including the chip package module. The chip package includes a first coupling portion and a second coupling portion that are coupled to each other on edges of a lead frame for mounting a chip thereon, and thus a package module is easily embodied by coupling the first coupling portion and the second coupling portion to each other.

61 Claims, 32 Drawing Sheets

LEAD FRAME FOR CHIP PACKAGE, CHIP PACKAGE, PACKAGE MODULE, AND ILLUMINATION APPARATUS INCLUDING CHIP PACKAGE MODULE

CROSS-REFERENCE TO RELATED APPLICATIONS

This application claims the benefit of Korean Patent Application No. 10-2010-0043171, filed on May 7, 2010, in the Korean Intellectual Property Office, the disclosure of which is incorporated herein in its entirety by reference.

BACKGROUND

1. Field

The present disclosure relates to lead frames for chip packages, chip packages, package modules, and illumination apparatuses including the package modules, which are used for packaging a plurality of chips.

2. Description of the Related Art

In general, with regard to chips, a primary packaging process is performed on chips in order to protect the chips and to easily electronically arrange the chips, and then a secondary packaging process is performed in order to mount the chips on a circuit board on which a circuit is formed by the chips together with other components. Thus, since a multistep packaging process is required to use chips in electronic devices, manufacturing costs may be increased.

For example, in order to use light-emitting device chips such as light-emitting diode (LED) chips in illumination apparatuses, a primary packaging process is performed in order to dispose phosphors and lenses on a lead frame, and then a secondary packaging process is performed in order to mount a plurality of light-emitting device chips on a circuit board on which a circuit is formed by these chips together with other components. A LED chip is a semiconductor device for emitting light having various colors by configuring a light source formed by a PN junction of a compound semiconductor, has a long lifetime, can be miniaturized and light-weight, and can be driven at a low voltage due to strong directivity of light generated from the LED. However, in order to use a light-emitting device chip such as the LED chip as an illustration device and to replace a general inexpensive illumination apparatus with the LED chips, manufacturing costs of the LED chips need to be reduced. Thus, a significant amount of research has been conducted into a method of reducing material costs and simplifying manufacturing processes.

SUMMARY

Provided are lead frames for chip packages, chip packages, package modules, and illumination apparatuses, in which structures of chip packages are improved to simplify a packaging process and to easily arrange a circuit of the chip packages.

Additional aspects will be set forth in part in the description which follows and, in part, will be apparent from the description, or may be learned by practice of the presented embodiments.

According to an aspect of the present invention, a lead frame for a chip package, the lead frame includes a mounting portion for mounting a chip thereon; a terminal portion for electrically connecting the chip to an external device; and a plurality of cleavage portions for connecting the mounting portion and the terminal portion to each other, wherein the cleavage portions are cut after the chip is mounted, wherein the terminal portion includes a first shaping terminal including a first coupling portion, and a second shape terminal including a second coupling portion that is coupled to the first coupling portion.

The first coupling portion and the second coupling portion may include concave and convex shapes so as to be coupled to each other.

The first coupling portion and the second coupling portion may include a protrusion, and a coupling groove into which the protrusion is inserted, respectively.

The lead frame may further include a plurality of mounting portions so as to mount a plurality of chips thereon.

The lead frame may further include a plurality of connection portions for electrically connecting the plurality of chips.

Each of the plurality of connection portions may include at least one intermediate connection portion for connecting the chips in series to each other; a first connection portion that is electrically connected to a first electrode of a foremost chip of the plurality of chips; and a second connection portion that is electrically connected to a second electrode of a rearmost chip of the plurality of chips, wherein the terminal portion may include a first terminal that extends from the first connection portion, and a second terminal that extends from the second connection portion.

The first connection portion, the intermediate portion, and the second connection portion may be arranged in a line, wherein the first terminal may include a first front terminal that is disposed at a front side of the plurality of connection portions, and a first rear terminal that is disposed at a rear side of the plurality of connection portions, and wherein the second terminal may include a second front terminal that is disposed at a front side of the plurality of connection portions, and a second rear terminal that is disposed at a rear side of the plurality of connection portions.

The first front terminal and the first rear terminal may include a first shape terminal and a second shape terminal, respectively, and the second front terminal and the second rear terminal may include a first shape terminal and a second shape terminal, respectively.

The first front terminal and the first rear terminal may include a first shape terminal and a second shape terminal, respectively, and the second front terminal and the second rear terminal may include a second shape terminal and a first shape terminal, respectively.

Each of the plurality of connection portions may include a first connection portion for electrically connecting first electrodes of the plurality of chips, and a second connection portion for electrically connecting second electrodes of the plurality of chips so that the plurality of chips are connected in parallel to each other.

According to another aspect of the present invention, a chip package includes a chip; and a lead frame including a mounting portion for mounting the chip thereon, and a terminal portion for electrically connecting the chip to an external device, wherein the terminal portion includes a first shaping terminal including a first coupling portion, and a second shape terminal including a second coupling portion that is coupled to the first coupling portion.

The first coupling portion and the second coupling portion may include concave and convex shapes so as to be coupled to each other.

The first coupling portion and the second coupling portion may include a protrusion, and a coupling groove into which the protrusion is inserted, respectively.

Any one of the first shape terminal and the second shape terminal may be stepped by a thickness of the lead frame.

The chip may include a plurality of light-emitting device chips, wherein the chip package may further include a plurality of mounting portions so as to mount a plurality of chips thereon, and wherein the lead frame may include a plurality of connection portions for electrically connecting the plurality of light-emitting device chips.

Each of the plurality of connection portions may include at least one intermediate connection portion for connecting the light-emitting device chips in series to each other; a first connection portion that is electrically connected to a first electrode of a foremost chip of the plurality of light-emitting device chips; and a second connection portion that is electrically connected to a second electrode of a rearmost chip of the plurality of light-emitting device chips, wherein the terminal portion may include a first terminal that extends from the first connection portion, and a second terminal that extends from the second connection portion.

The plurality of light-emitting device chips may be arranged in a line. In this case, the first terminal may include a first front terminal that is disposed at a front side of the plurality of connection portions, and a first rear terminal that is disposed at a rear side of the plurality of connection portions, wherein the second terminal may include a second front terminal that is disposed at a front side of the plurality of connection portions, and a second rear terminal that is disposed at a rear side of the plurality of connection portions, and wherein the connection portion may include a first extension portion that extends from the first connection portion to the first rear terminal along one side of an arrangement line of the plurality of light-emitting device chips, and a second extension portion that extends from the second connection portion to the second front terminal along the other side of the arrangement line of the plurality of light-emitting device chips.

The first front terminal and the first rear terminal may include a first shape terminal and a second shape terminal, respectively, and the second front terminal and the second rear terminal may include a first shape terminal and a second shape terminal, respectively.

The first front terminal and the first rear terminal may include a first shape terminal and a second shape terminal, respectively, and the second front terminal and the second rear terminal may include a second shape terminal and a first shape terminal, respectively.

The chip package may further include a third coupling portion formed at an edge of the first extension portion, and at least one fourth coupling portion that is formed at an edge of the second extension portion so as to be coupled to the at least one third coupling portion.

The first extension portion and the second extension portion may each be coupled to the at least one intermediate connection portion by a coupling member formed of an insulating material.

The coupling member may extend beyond edges of at least portions of the first extension portion and the second extension portion.

The coupling member may be integrated with a reflective cavity for reflecting light emitted from the light-emitting device chip.

The chip package may further include a reflective cavity for reflecting light emitted from the light-emitting device chip, wherein the reflective cavity may couple the first connection portion, the intermediate connection portion, and the second connection portion to each other.

The plurality of connection portions may include a first connection portion for electrically connecting first electrodes of the plurality of chips, and a second connection portion for electrically connecting second electrodes of the plurality of chips so that the plurality of chips are connected in parallel to each other, and the terminal portion may include a first terminal that extends from the first connection portion, and a second terminal that extends from the second terminal.

The plurality of light-emitting device chips may be arranged in a line. In this case, the first terminal may include a first front terminal that is disposed at a front side of the plurality of connection portions, and a first rear terminal that is disposed at a rear side of the plurality of connection portions, and the second terminal may include a second front terminal that is disposed at a front side of the plurality of connection portions, and a second rear terminal that is disposed at a rear side of the plurality of connection portions.

The first front terminal and the first rear terminal may include a first shape terminal and a second shape terminal, respectively, and the second front terminal and the second rear terminal may include a first shape terminal and a second shape terminal, respectively.

The first front terminal and the first rear terminal may include a first shape terminal and a second shape terminal, respectively, and the second front terminal and the second rear terminal may include a second shape terminal and a first shape terminal, respectively.

The chip package may further include a third coupling portion formed at an edge of the first connection portion, and at least one fourth coupling portion that is formed at an edge of the second connection portion so as to be coupled to the at least one third coupling portion.

The first connection portion, the intermediate connection portion, and the second connection portion may be coupled to each other by a coupling member formed of an insulating material.

The chip package may further include a reflective cavity for reflecting light emitted from the light-emitting device chip, wherein the reflective cavity may couple the first connection portion, the intermediate connection portion, and the second connection portion to each other.

The plurality of mounting portions are disposed on some of the plurality of connection portions.

The plurality of mounting portions may be disposed between the plurality of connection portions, and the plurality of mounting portions and the plurality of connection portions may be coupled to each other by a coupling member formed of an insulating material. In this case, the plurality of mounting portions may be formed of a thermal conductive material.

The plurality of light-emitting device chips may be connected to the plurality of connection portions by using a wire-bonding method.

The plurality of light-emitting device chips may be connected to the plurality of connection portions by using a flip-chip bonding method.

The chip package may further include a reflective cavity for reflecting light emitted from the plurality of light-emitting device chips.

The chip package may further include a lens for refracting light emitted from the plurality of light-emitting device chips.

Each of the plurality of light-emitting device chips may be a GaN-based light-emitting diode chip, and the plurality of light-emitting device chips may be coated by a transmissive resin including a phosphor.

According to another aspect of the present invention, a package module includes a first chip package and a second chip package, wherein each of the first chip package and the second chip package includes a chip; and a lead frame including a mounting portion for mounting the chip thereon, and a terminal portion for electrically connecting the chip to an external device, wherein the terminal portion may include a first shaping terminal including a first coupling portion, and a second shape terminal including a second coupling portion that is coupled to the first coupling portion, wherein a first shape terminal of the first chip package and a second shape terminal of the second chip package may be electrically connected to each other so as to be coupled to each other.

The first coupling portion and the second coupling portion may include concave and convex shapes so as to be coupled to each other.

The first coupling portion and the second coupling portion may include a protrusion, and a coupling groove into which the protrusion is inserted, respectively.

The chip may include a plurality of light-emitting device chips, wherein the chip package may further include a plurality of mounting portions so as to mount a plurality of chips thereon, and wherein the lead frame may include a plurality of connection portions for electrically connecting the plurality of light-emitting device chips.

Each of the plurality of connection portions may include at least one intermediate connection portion for connecting the light-emitting device chips in series to each other; a first connection portion that is electrically connected to a first electrode of a foremost chip of the plurality of light-emitting device chips; and a second connection portion that is electrically connected to a second electrode of a rearmost chip of the plurality of light-emitting device chips, wherein the terminal portion may include a first terminal that extends from the first connection portion, and a second terminal that extends from the second connection portion.

The plurality of light-emitting device chips may be arranged in a line, wherein the first terminal may include a first front terminal that is disposed at a front side of the plurality of connection portions, and a first rear terminal that is disposed at a rear side of the plurality of connection portions, wherein the second terminal may include a second front terminal that is disposed at a front side of the plurality of connection portions, and a second rear terminal that is disposed at a rear side of the plurality of connection portions, and wherein the connection portion may include a first extension portion that extends from the first connection portion to the first rear terminal along one side of an arrangement line of the plurality of light-emitting device chips, and a second extension portion that extends from the second connection portion to the second front terminal along the other side of the arrangement line of the plurality of light-emitting device chips.

The first front terminal and the first rear terminal may include a first shape terminal and a second shape terminal, respectively, and the second front terminal and the second rear terminal may include a first shape terminal and a second shape terminal, respectively, wherein the first rear terminal of the first chip package and the first front terminal of the second chip package may be electrically connected to each other so as to be coupled to each other, wherein the second rear terminal of the first chip package and the second front terminal of the second package may be electrically connected to each other so as to be coupled to each other, and wherein the first chip package and the second chip package may be connected in a line along which the plurality of light-emitting device chips are arranged.

The first front terminal and the first rear terminal may include a first shape terminal and a second shape terminal, respectively, and the second front terminal and the second rear terminal may include a second shape terminal and a first shape terminal, respectively, wherein the first rear terminal of the first chip package and the first front terminal of the second chip package may be electrically connected to each other so as to be coupled to each other, wherein the second rear terminal of the first chip package and the second front terminal of the second package may be electrically connected to each other so as to be coupled to each other, and wherein the first chip package and the second chip package may be connected in a line along which the plurality of light-emitting device chips are arranged.

The package module may further include a third coupling portion formed at an edge of the first extension portion, and at least one fourth coupling portion that is formed at an edge of the second extension portion so as to be coupled to the at least one third coupling portion, wherein the at least one fourth coupling portion of the first chip package and the at least one third coupling portion of the second chip package may be electrically connected to each other so as to be coupled to each other, and wherein the first chip package and the second chip package may be perpendicularly connected in a line along which the plurality of light-emitting device chips are arranged.

The plurality of connection portions may include a first connection portion for electrically connecting first electrodes of the plurality of chips, and a second connection portion for electrically connecting second electrodes of the plurality of chips so that the plurality of chips are connected in parallel to each other, and wherein the terminal portion may include a first terminal that extends from the first connection portion, and a second terminal that extends from the second terminal.

The plurality of light-emitting device chips may be arranged in a line, wherein the first terminal may include a first front terminal that is disposed at a front side of the plurality of connection portions, and a first rear terminal that is disposed at a rear side of the plurality of connection portions, and wherein the second terminal may include a second front terminal that is disposed at a front side of the plurality of connection portions, and a second rear terminal that is disposed at a rear side of the plurality of connection portions.

The first front terminal and the first rear terminal may include a first shape terminal and a second shape terminal, respectively, and the second front terminal and the second rear terminal may include a first shape terminal and a second shape terminal, respectively, wherein the first rear terminal of the first chip package and the first front terminal of the second chip package may be electrically connected to each other so as to be coupled to each other, wherein the second rear terminal of the first chip package and the second front terminal of the second package may be electrically connected to each other so as to be coupled to each other, and wherein the first chip package and the second chip package may be connected in a line along which the plurality of light-emitting device chips are arranged.

The first front terminal and the first rear terminal may include a first shape terminal and a second shape terminal, respectively, and the second front terminal and the second rear terminal may include a second shape terminal and a first shape terminal, respectively, the first rear terminal of the first chip package and the first front terminal of the second chip package may be electrically connected to each other so as to be coupled to each other, wherein the second rear terminal of the first chip package and the second front terminal of the second package are electrically connected to each other so as to be coupled to each other, and the first chip package and the second chip package may be connected in a line along which the plurality of light-emitting device chips are arranged.

The package module may further include a third coupling portion formed at an edge of the first extension portion, and at least one fourth coupling portion that is formed at an edge of the second extension portion so as to be coupled to the at least one third coupling portion, herein the at least one fourth coupling portion of the first chip package and the at least one third coupling portion of the second chip package are electrically connected to each other so as to be coupled to each other, and wherein the first chip package and the second chip package may be perpendicularly connected in a line along which the plurality of light-emitting device chips are arranged.

According to another aspect of the present invention, an illumination apparatus includes the package module; and a power supplying unit for supplying power to the package module.

The power supplying unit may include an interface for receiving power; and a power controller for controlling power supplied to the illumination module.

The package module may include a backlight unit for emitting light to a non-self light-emitting display apparatus.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
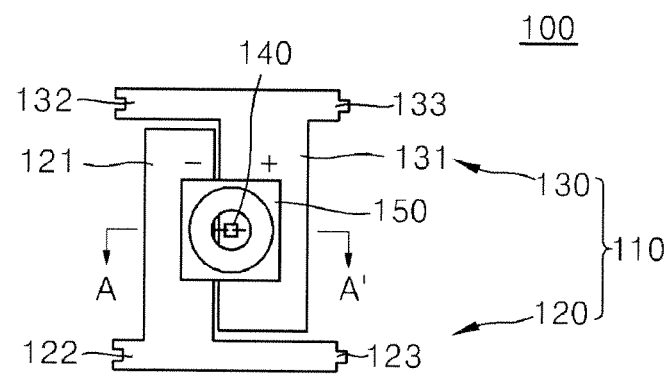
FIG. 1 is a schematic plan view of a chip package according to an embodiment of the present invention.

Reference will now be made in detail to embodiments, examples of which are illustrated in the accompanying drawings, wherein like reference numerals refer to the like elements throughout, and the thicknesses of layers and regions are exaggerated for clarity.

Figure 2:
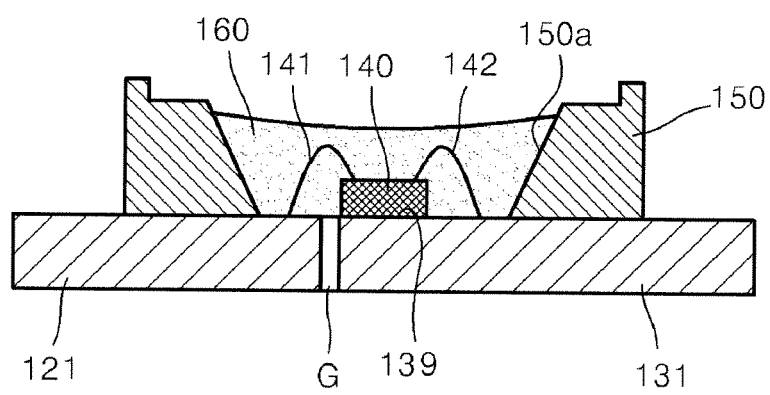
FIG. 2 is a cross-sectional view of the chip package of FIG. 1 taken along a line A-A'.

FIG. 1 is a schematic plan view of a chip package 100 according to an embodiment of the present invention. FIG. 2 is a cross-sectional view of the chip package 100 of FIG. 1 taken along a line A-A'.

Referring to FIGS. 1 and 2, the chip package 100 includes a light-emitting device chip 140, a lead frame 110 for electrically connecting the light-emitting device chip 140 to an external device, and a reflective cavity 150 for reflecting light emitted from the light-emitting device chip 140 to guide the light outwards.

The lead frame 110 may be formed of a conductive metal such as aluminum (Al), or copper (Cu) by using a press process, an etching process, or the like. The lead frame 110 includes a first frame portion 120 and a second frame portion 130 that are separately formed from each other. The first frame portion 120 and the second frame portion 130 are fixed to each other by the reflective cavity 150 formed of an insulating resin.

The first frame portion 120 includes a first connection portion 121, a first front terminal 122, and a first rear terminal 123. The first connection portion 121 is connected to a negative (−) electrode of the light-emitting device chip 140. The first front terminal 122 extends from the first connection portion 121 towards a front end of the chip package 100, and the first rear terminal 123 extends from the first connection portion 121 towards a rear end of the chip package 100.

The second frame portion 130 includes a second connection portion 131, a second front end terminal 132, and a second rear terminal 133. The second connection portion 131 is connected to a positive (+) electrode of the light-emitting device chip 140. The second front end terminal 132 extends from the second connection portion 131 towards the front end of the chip package 100, and the second rear terminal 133 extends from the second connection portion 131 towards the rear end of the chip package 100. The first connection portion 121 and the second connection portion 131 are spaced apart from each other by a predetermined gap (G). The second connection portion 131 includes a mounting portion 139 for mounting the light-emitting device chip 140 thereon. The chip package 100 is a chip on lead-frame type package in which the light-emitting device chip 140 is mounted directly on the mounting portion 139 of the lead frame 110. A bonding pad (not shown) for facilitating bonding of a plurality of light-emitting device chips 140 may be attached to the mounting portion 139. If necessary, the mounting portion 139 may be formed on the first connection portion 121.

The first front terminal 122 and the second front end terminal 132 are formed at the front end of the chip package 100, and function as a negative (−) terminal and a positive (+) terminal, respectively. The first rear terminal 123 and the second rear terminal 133 are formed at the rear end of the chip package 100, and function as a negative (−) terminal and a positive (+) terminal, respectively. In this case, the first and second front terminals 122 and 132, and the first and second rear terminals 123 and 133 constitute an end portion of the chip package 100. According to the present embodiment, for convenience of description, the first frame portion 120 is connected to the negative (−) electrode, and the second frame portion 130 is connected to the positive (+) electrode. However, the positive (+) electrode and the negative (−) electrode may vary according to a wiring direction of the light-emitting device chip 140.

Each of the first front terminal 122 and the second front end terminal 132 includes a first coupling portion, and each of the first rear terminal 123 and the second rear terminal 133 includes a second coupling portion. The first coupling portion and the second coupling portion have concave and convex shapes so as to be coupled to each other. That is, each of the first front terminal 122 and the second front end terminal 132 includes the first coupling portion having a concave rectangular shape, and each of the first rear terminal 123 and the second rear terminal 133 includes the second coupling portion having a convex rectangular shape.

The light-emitting device chip 140 may be a light-emitting diode (LED) chip that includes two electrodes, which are the positive (+) and negative (−) electrodes, as devices. The LED chip may emit blue light, green light, red light, or the like, according to a material used to form the LED chip. Furthermore, the LED chip may emit light beams with various colors, such as white light, or the like, by coating phosphors on a surface of the LED chip.

For example, a blue LED chip may include a plurality of quantum-well active layers that are formed by alternately forming GaN and InGaN. In this case, a P-type clad layer and an N-type clad layer may be formed on or below the quantum-well active layers, and may be formed of a compound semiconductor such as $Al_XGa_YN_Z$. An LED chip disclosed in Korean Application No. 2010-015422 or 2010-018259 may be used as the light-emitting device chip 140.

According to the present embodiment, the light-emitting device chip 140 is an LED chip, but is not limited thereto. For example, the light-emitting device chip 140 may be an ultraviolet (UV) ray diode chip, a laser diode chip, an organic light emitting diode (OLED) chip, or the like.

The reflective cavity 150 is formed on the first connection portion 121 and the second connection portion 131 so as to surround the light-emitting device chip 140. Light emitted from the light-emitting device chip 140 is reflected off a reflective surface 150a so as be emitted out of the light-emitting device chip 140 within a predetermined range of a reflection angle, thereby improving an efficiency of extracting the light, which was emitted from the light-emitting device chip 140, outwards. The reflective cavity 150 may be formed of an insulating resin such as an epoxy resin, a silicon resin, plastic, or the like by using an injection molding method.

The light-emitting device chip 140 may be installed in a space surrounded by the reflective cavity 150, and then the space may be filled with a transmissive resin 160 in order to protect the light-emitting device chip 140. In addition, the transmissive resin 160 includes a phosphor so as to emit predetermined fluorescence. For example, when the light-emitting device chip 140 is a blue LED chip or a UV ray diode chip, the transmissive resin 160 includes blue, red and green phosphor powders, thereby realizing white light. The phosphor may be an oxide-based phosphor, a nitride-based phosphor, a sulfide-based phosphor, a silicate-based phosphor, a phosphate-based phosphor, a selenide-based phosphor, or a phosphor using a quantum dot. In detail, a greenish phosphor may be a YAG-based phosphor, a green phosphor may be a nitride-based phosphor such as $Ca_AAl_BO_CN_D$, and a green phosphor may be a silcide-based phosphor such as $(Ba, Sr)_X Si_YO_Z$.

Since the reflective cavity 150 is formed on the first connection portion 121 and the second connection portion 131, the first connection portion 121 and the second connection portion 131 are fixed to each other by the reflective cavity 150.

An insulating material may be coated to form an insulating layer (not shown) on the lead frame 110 except for a portion for electrical connection of the light-emitting device chip 140 or terminals. The insulating layer may be formed of the same material as the reflective cavity 150, and may be simultaneously formed with the reflective cavity 150.

Figure 3:
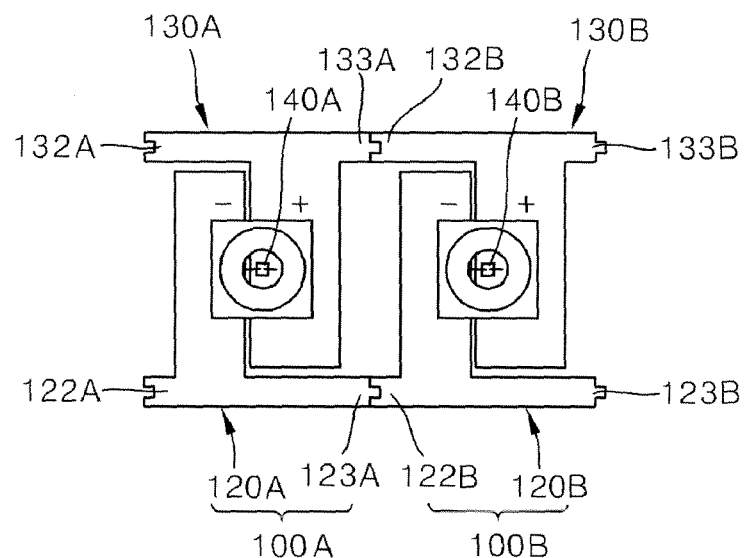
FIG. 3 is a plan view of a package module in which a first chip package and a second chip package are connected in parallel to each other, according to an embodiment of the present invention.
Figure 4:
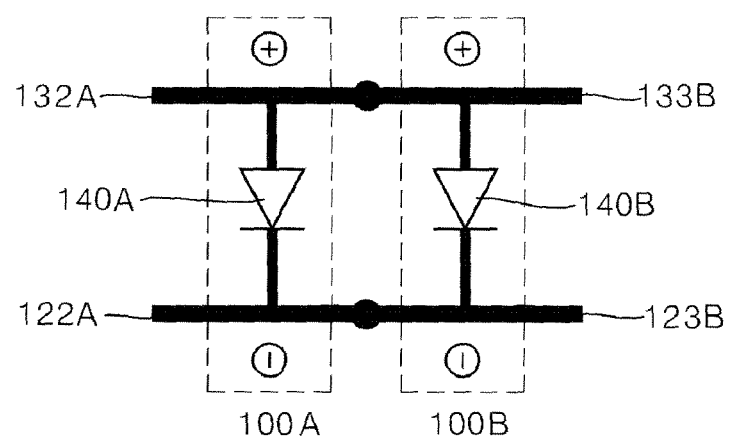
FIG. 4 is a circuit diagram of a package module of FIG. 3.

FIG. 3 is a plan view of a package module in which a first chip package 100A and a second chip package 100B are connected in parallel to each other, according to an embodiment of the present invention. FIG. 4 is a circuit diagram of the package module of FIG. 3.

The package module according to the present embodiment includes the first chip package 100A and the second chip package 100B. The first chip package 100A and the second chip package 100B are instrumentally and electrically connected to each other. Each of the first chip package 100A and the second chip package 100B corresponds to the chip package 100 described with reference to FIGS. 1 and 2.

As described with reference to FIGS. 1 and 2, since the first chip package 100A and the second chip package 100B include coupling portions formed on respective terminals, the first chip package 100A and the second chip package 100B may be directly connected to each other. That is, a second convex coupling portion of a first rear terminal 123A of the first chip package 100A is coupled to a first concave coupling portion of a first front terminal 123B of the second chip package 100B, and a second convex coupling portion of a second rear terminal 133A of the first chip package 100A is coupled to a first concave portion of a second front terminal 133B of the second chip package 100B. Thus, the first chip package 100A and the second chip package 100B are instrumentally and electrically connected to each other. In this case, a negative (−) electrode of a light-emitting device chip 140A of the first chip package 100A is connected to a negative (−) electrode of a light-emitting device chip 140B of the second chip package 100B, and a positive (+) electrode of the light-emitting device chip 140A of the first chip package 100A is connected to a positive (+) electrode of the light-emitting device chip 140B of the second chip package 100B. Thus, the package module according to the present embodiment may include a structure in which the first chip package 100A and the second chip package 100B are connected in parallel to each other, as shown in FIG. 4.

In the package module according to the present embodiment, the chip packages 100A and 100B may be directly connected without mounting the chip packages 100A and 100B on a separate substrate or soldering the chip packages 100A and 100B together. In addition, terminals of front and rear ends of the package module, which are exposed out of the package module, may be coupled to a socket, or various connectors, and thus the package module may be directly used as an illumination module of an illumination apparatus.

Figure 5A:
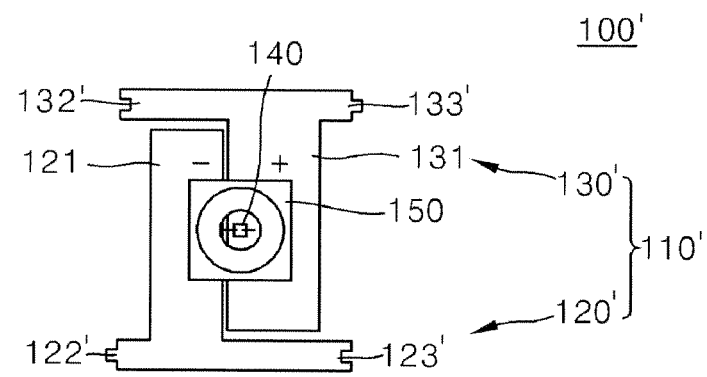
FIGS. 5A and 5B are plan views for explaining modified examples of first and second coupling portions of the chip package of FIG. 1, according to embodiments of the present invention.
Figure 5B:
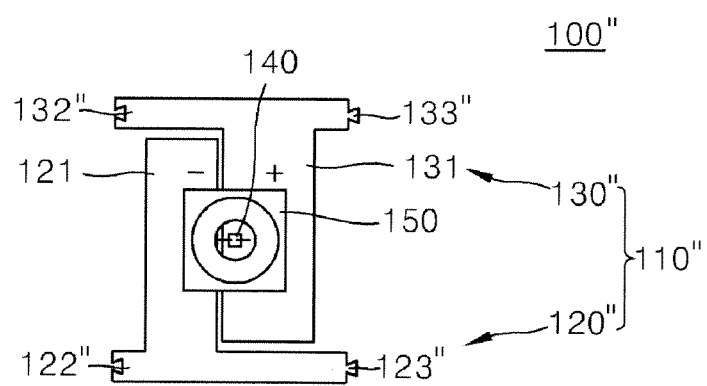

The coupling portions of the terminals may be variously changed according to embodiments of the present invention. FIGS. 5A and 5B are plan views for explaining modified examples of the first and second coupling portions of the chip package 100 of FIG. 1, according to embodiments of the present invention. Chip packages 100' and 100" of FIGS. 5A and 5B are each the same as the chip package 100 except for a coupling structure formed on each terminal.

Referring to FIG. 5A, the chip package 100' includes a first front terminal 122' and a second front terminal 132' which each include a second convex coupling portion and a first concave coupling portion, and a first rear terminal 123' and a second rear terminal 133' which each include a first concave coupling portion and a second convex coupling portion. The chip package 100' is different from the chip package 100 described with reference to FIGS. 1 and 2 in that the chip package 100 includes the first front terminal 122 and the second front end terminal 132 which include coupling structures having the same shape (i.e., the first coupling portion), and the first rear terminal 123 and the second rear terminal 133 which include coupling structures having the same shape (i.e., the second coupling portion). Since the chip package 100' includes the first concave coupling portion and the second convex coupling portion which are formed at front and rear ends of the chip package 100', and have complementary shapes, a front end and a rear end of the chip package 100' may also be coupled to a front end and a rear end of another chip package 100', respectively (see FIG. 23).

Referring to FIG. 5B, the chip package 100" includes a first front terminal 122" and a second front terminal 132" which each include a first concave coupling portion having an inverted triangular shape, and a first rear terminal 123" and a second rear terminal 133" which each include a second convex coupling portion having an inverted triangular shape. The chip package 100" is different from the chip package 100 described with reference to FIGS. 1 and 2 in that the first coupling portion of the chip package 100 has a concave rectangular shape, and the second coupling portion of the chip package 100 has a convex rectangular shape. When the first coupling portion and the second coupling portion of the chip package 100" of FIG. 5B are meshed to coupling portions of another chip package 100", the chip package 100" and another chip package 100" may not be decoupled in a longitudinal direction. In FIG. 5B, the first coupling portion and the second coupling portion have concave and convex inverted-triangular shapes, respectively, but may have various complementary shapes.

In the chip package 100 described with reference to FIGS. 1 and 2, the light-emitting device chip 140 is bonded to the lead frame 110 by using a wire-bonding method within the reflective cavity 150, but the present embodiment is not limited thereto.

FIGS. 6A through 6D are cross-sectional of modified examples of mounting a light-emitting device chip 140 according to embodiments of the present invention.

Figure 6A:
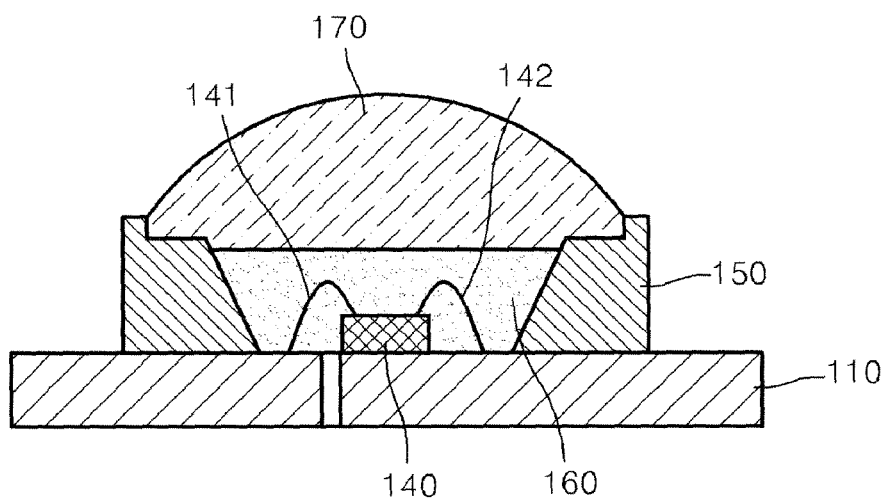
FIGS. 6A through 6D are cross-sectional of modified examples of mounting a light-emitting device chip 140 according to embodiments of the present invention.

Referring to FIG. 6A, a lens 170 may be disposed on the reflective cavity 150 for accommodating the light-emitting device chip 140 therein. The lens 170 may condense or diverge light emitted from the light-emitting device chip 140 so as to appropriately distribute the light. The lens 170 may be formed of a transparent resin or glass. In addition, the lens 170 may be formed directly on the reflective cavity 150, or alternatively, may be previously formed, and then may be attached onto the reflective cavity 150. The transmissive resin 160 and the lens 170 may be formed integrally with each other. A chip package of FIG. 6A is the same as the chip package 100 of FIG. 1 except for the lens 170, and thus, a description thereof will not be repeated here.

Figure 6B:
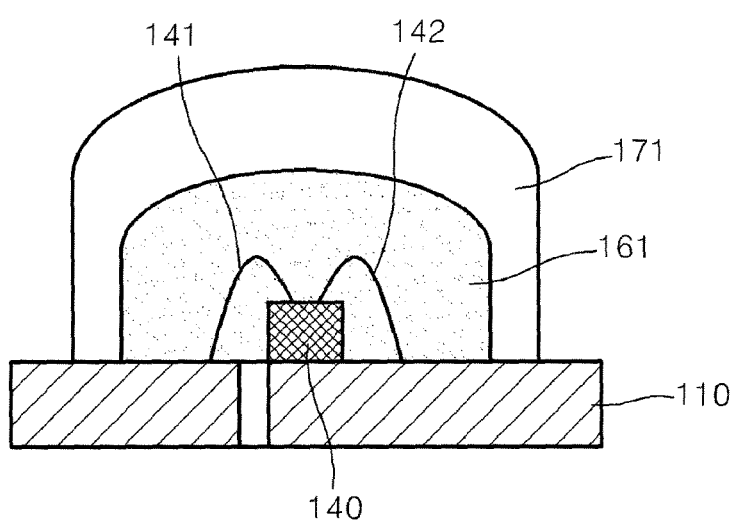
Figure 6C:
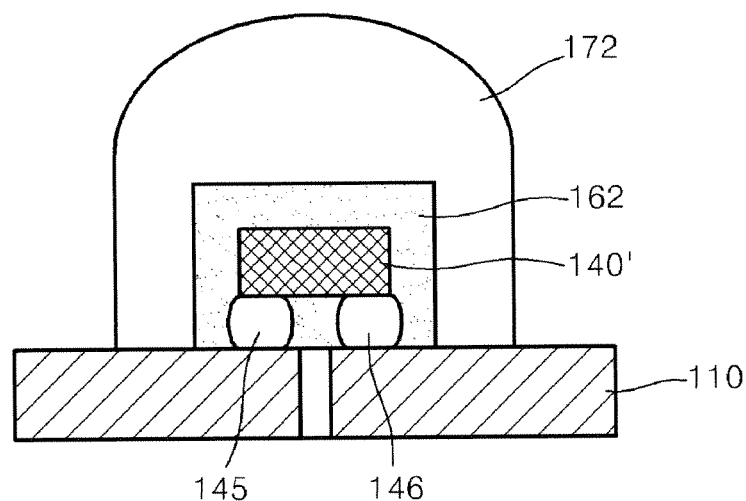

So far, a case where the reflective cavity 150 is provided has been described, but embodiments of the present invention are not limited to this case. As shown in FIGS. 6B and 6C, the reflective cavity 150 may be omitted.

In FIG. 6B, a transmissive resin 161 is coated on the light-emitting device chip 140 that is bonded to the lead frame 110 by using a wire-bonding method without a reflective capacity. When the transmissive resin 161 includes various phosphors, the transmissive resin 161 may emit white light or fluorescence. Alternatively, a plurality of layers formed of the transmissive resin 161 including the phosphors may be coated on the light-emitting device chip 140. For example, a first layer of the transmissive resin 161 may include a red phosphor, and a second layer of the transmissive resin 161 may include a green phosphor.

As shown in FIG. 6B, a lens 171 is disposed on the transmissive resin 161 so as to condense or diverge light emitted from the light-emitting device chip 140. The transmissive resin 161 and the lens 171 may be formed integrally with each other.

In FIG. 6C, the light-emitting device chip 140' is bonded to the lead frame 110 by using a flip-chip bonding method. In this case, the light-emitting device chip 140' is electrically connected to the lead frame 110 by bumps 45 and 46 formed of a conductive material such as gold (Au). When the flip-chip bonding method is used, light is emitted from a surface of the light-emitting device chip 140' that is opposite to a surface bonded to the lead frame 110. A transmissive resin 162 may be coated on the light-emitting device chip 140' that is bonded to the lead frame 100 by using the flip-chip bonding method. A phosphor may be sprayed on the transmissive resin 162. The transmissive resin 162 may be formed in a film shape, and may cover the light-emitting device chip 140'. Furthermore, a lens 172 may be formed on the transmissive resin 162.

When there is no reflective cavity, like in FIGS. 6B and 6C, the first connection portion 121 and the second connection portion 131 of the lead frame 110 may be fixed to each other by the transmissive resin 161 or 162, the lens 171 or 172, or a separate coupling member (not shown).

Figure 6D:
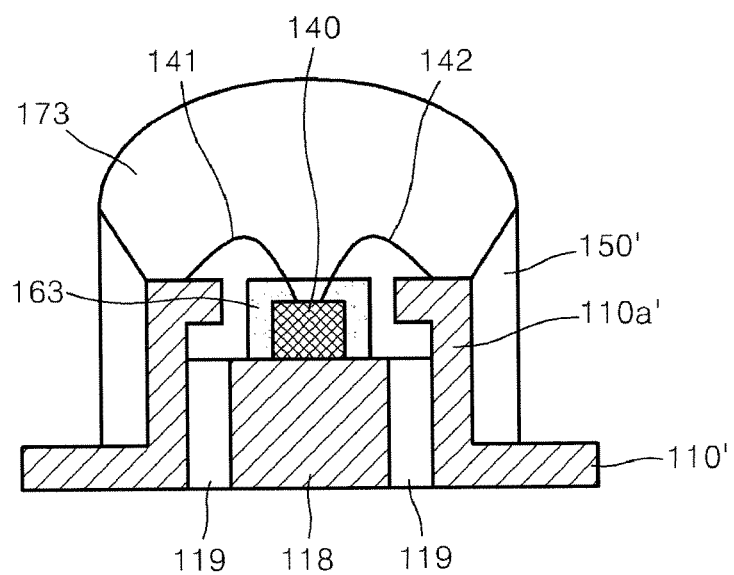

So far, cases where the mounting portion 139 for mounting the light-emitting device chip 140 or 140' is disposed on the first connection portion 121 or the second connection portion 131 have been described, but embodiments of the present invention are not limited to these cases. Referring to FIG. 6D, a lead frame 110' includes a bent portion 110'a that defines a predetermined space. A heat slug 118 is disposed in the space defined by the bent portion 110'a so as to be spaced apart from the bent portion 110'a. The heat slug 118 is fixed to the lead frame 110' by a fixation member 119. The heat slug 118 is used for mounting the light-emitting device chip 140 thereon. That is, the light-emitting device chip 140 is bonded to the heat slug 118, and is electrically connected to the bent portion 110'a of the lead frame 110' through wires 141 and 142. The heat slug 118 is formed of a metal having a high thermal conductivity so as to function as a path for dissipating heat generated from the light-emitting device chip 140. A transmissive resin 163 may be coated on the light-emitting device chip 140, and may include a phosphor. In addition, the light-emitting device chip 140 may be surrounded by a reflective cavity 150'. A lens 174 may be disposed above the light-emitting device chip 140. According to the present embodiment, the heat dissipation properties of a chip package of FIG. 6D may be improved by the heat slug 118. Alternatively, various known structures for dissipating heat may be used.

In the chip package 100 described with reference to FIGS. 1 and 2, or the chip package described with reference to FIG. 6B or 6C, a single light-emitting device chip 140 is disposed in a space defined by the reflective cavity 150 (see FIG. 2), or the transmissive resin 160, 161 or 162, but a plurality of light-emitting device chips may be disposed in the space. For example, an amount of light may be increased by disposing light-emitting device chips for emitting light beams with the same color in the space, or color rendering properties may be increased by disposing light-emitting device chips for light beams with different colors. Likewise, when a plurality of light-emitting device chips are mounted in the space, the light-emitting device chips may be connected to each other at a wafer level, or may be bond to the lead frame 110, and then may be connected in parallel and/or series to each other by using various known methods. A Zener diode chip may also be mounted in order to protect the light-emitting device chip 140.

Figure 7:
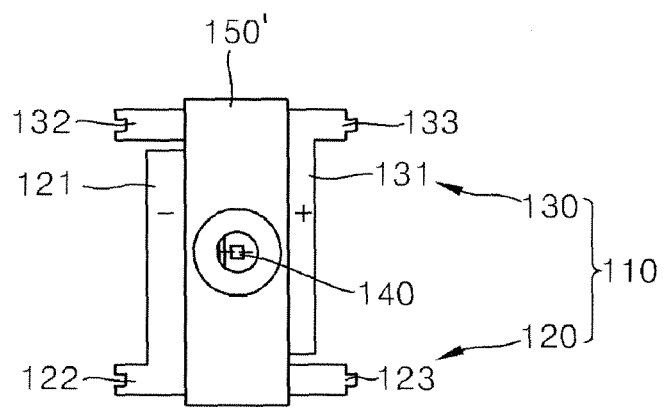
FIG. 7 is a plan view of a modified example of a reflective cavity of the chip package of FIG. 1, according to an embodiment of the present invention.

The described with reference to FIGS. 1 and 2 is formed on the first connection portion 121 and the second connection portion 131, but is not limited thereto. FIG. 7 is a plan view of a modified example of the reflective cavity 150 of the chip package 100 of FIG. 1, according to an embodiment of the present invention.

The reflective cavity 150' is formed on the first connection portion 121 and the second connection portion 131 to extend beyond outer edges of the first connection portion 121 and the second connection portion 131. That is, since the reflective cavity 150' is formed so as to extend beyond an outer edge of the lead frame 110, the first connection portion 121 and the second connection portion 131 are fixed to each other, and the first rear terminal 123 extending from the first connection portion 121, and the second front end terminal 132 extending from the second connection portion 131 may also be fixed to each other. Furthermore, since the reflective cavity 150' is formed so as to extend beyond an edge of the lead frame 110, the insulating property of the chip package 100 may be improved. The reflective cavity 150' may be formed so as to surround the lead frame 110, or may be formed only on the lead frame 110.

Figure 8:
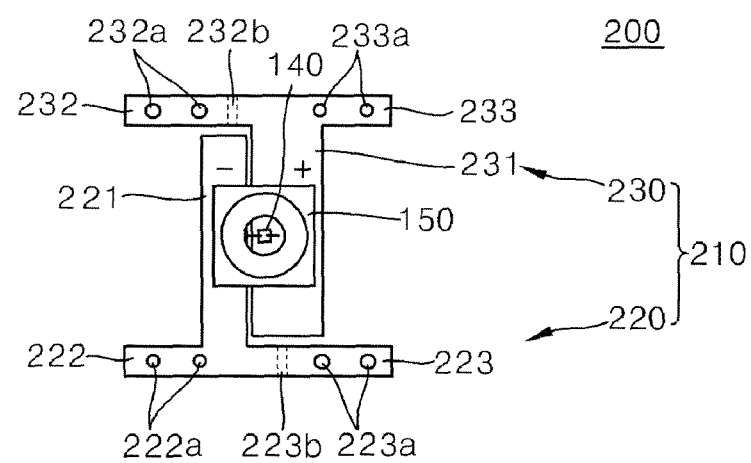
FIG. 8 is a schematic plan view of a chip package according to another embodiment of the present invention.
Figure 9A:
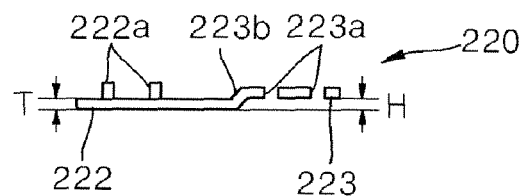
FIGS. 9A and 9B are schematic cross-sectional views of a first frame portion and a second frame portion of FIG. 8, respectively, according to embodiments of the present invention.
Figure 9B:
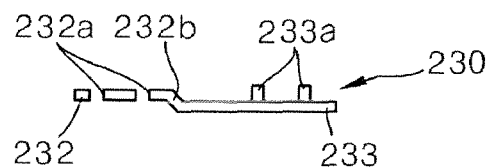

FIG. 8 is a schematic plan view of a chip package 100 according to another embodiment of the present invention. FIGS. 9A and 9B are schematic cross-sectional views of a first frame portion 220 and a second frame portion 230 of FIG. 8, respectively, according to embodiments of the present invention. The chip package 200 is materially the same as the above-described chip package 100 except for a coupling structure formed on a lead frame 210. The above-described embodiments may be applied to a mounting structure of the light-emitting device chip 140 and a structure of the reflective cavity 150.

Referring to FIGS. 8, 9A and 9B, the chip package 200 includes the light-emitting device chip 140, the lead frame 210 for electrically connecting the light-emitting device chip 140 to an external device, and the reflective cavity 150 for reflecting light emitted from the light-emitting device chip 140 to guide outwards the light. The lead frame 210 includes the first frame portion 220 and the second frame portion 230 that are separately formed from each other. The first frame portion 220 and the second frame portion 230 are fixed to each other by the reflective cavity 150 formed of an insulating resin.

The first frame portion 220 includes a first connection portion 221, a first front terminal 222, and a first rear terminal 223. The first connection portion 221 is connected to a negative (−) electrode of the light-emitting device chip 140. The first front terminal 222 extends from the first connection portion 221 towards a front end of the chip package 200, and the first rear terminal 223 extends from the first connection portion 221 towards a rear end of the chip package 200. The second frame portion 230 includes a second connection portion 231, a second front terminal 232, and a second rear terminal 233. The second connection portion 231 is connected to a positive (+) electrode of the light-emitting device chip 140. The second front terminal 232 extends from the second connection portion 231 towards the front end of the chip package 200, and the second rear terminal 233 extends from the second connection portion 231 towards the rear end of the chip package 200.

The first front terminal 222 and the second front terminal 232 include a first coupling portion and a second coupling portion, respectively, and the first rear terminal 223 and the second rear terminal 233 include a second coupling portion and a first coupling portion, respectively. The first coupling portions of the first front terminal 222 and the second rear terminal 233 include at least one protrusion 222a and at least one protrusion 233a, respectively. The second coupling portions of the second front terminal 232 and the first rear terminal 223 include coupling grooves 232a and 223a corresponding to the protrusions 222a and 233a, respectively. The protrusions 222a and 233a may be formed of an insulating layer by using an injection molding method, and may be formed simultaneously with the reflective cavity 150. Alternatively, the protrusions 222a and 233a may be formed by forming protrusions from the lead frame 210 by using a press process during a chip packaging process.

The protrusions 222a and 233a, and the coupling grooves 232a and 223a are coupled to each other by overlapping the lead frame 210 with another lead frame 210. Thus, in order to prevent distortion of the lead frame 210 when the chip package 200 is coupled to another chip package 200, some of the first front terminal 222, the second front terminal 232, the first rear terminal 223 and the second rear terminal 233 may be bent and stepped. For example, as shown in FIGS. 9A and 9B, the first rear terminal 223 and the second front terminal 232 including the coupling grooves 223a and 232a may include bent portions 223b and 232b, respectively, and the bent portions 223b and 232b may each be formed to have a step 'H' therebetween. In this case, the step 'H' may be the same as a thickness 'T' of the lead frame 210.

According to the present embodiment, the first rear terminal 223 and the second front terminal 232 including the coupling grooves 223a and 232a are bent, but the present embodiment is not limited thereto. For example, the first front terminal 222 and the second rear terminal 233 including the protrusions 222a and 233a may be bent with the step 'H'.

According to the present embodiment, in the chip package 200, the protrusions 222a and 233a, and the coupling grooves 232a and 223a are formed at front and rear ends of the chip package 200, but the present embodiment is not limited thereto. For example, only the protrusions 222a and 233a may be formed on the first front terminal 222 and the second front terminal 232, and only the coupling grooves 232a and 223a may be formed on the first rear terminal 223 and the second rear terminal 233.

Figure 10:
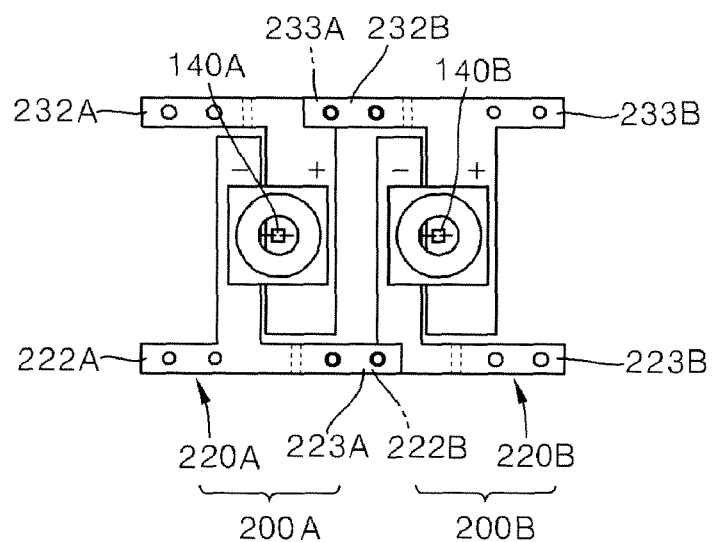
FIG. 10 is a plan view of a package module in which a first chip package and a second chip package are connected in parallel to each other, according to another embodiment of the present invention.
Figure 11A:
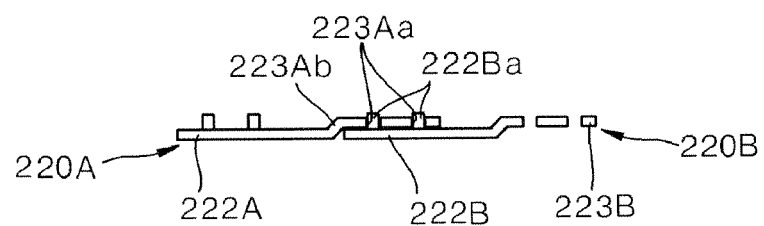
FIGS. 11A and 11B are cross-sectional views for explaining a coupling structure of the package module of FIG. 10.
Figure 11B:
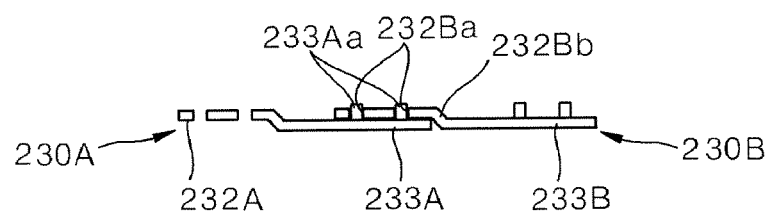

FIG. 10 is a plan view of a package module in which a first chip package 200A and a second chip package 200B are connected in parallel to each other, according to another embodiment of the present invention. FIGS. 11A and 11B are cross-sectional views for explaining a coupling structure of the package module of FIG. 10.

The package module according to the present embodiment includes the first chip package 200A and the second chip package 200B. The first chip package 200A and the second chip package 200B are instrumentally and electrically connected to each other. Each of the first chip package 200A and the second chip package 200B corresponds to the chip package 200 described with reference to FIGS. 8, 9A and 9B.

A protrusion 222Ba of a first front terminal 223B of the second chip package 200B is inserted into a coupling groove 223Aa of a first rear terminal 223A of the first chip package 200A, and a protrusion 233Aa of a second rear terminal 233A of the first chip package 200A is inserted into a coupling groove 233Aa of a second front terminal 233B of the second chip package 200B. Thus, the first chip package 200A and the second chip package 200B are instrumentally and electrically connected to each other. In this case, referring to FIGS. 11A and 11B, the first rear terminal 223A of the first chip package 200A, and the second front terminal 233B of the second chip package 200B are each formed to have a step 'H' therebetween, and thus the first chip package 200A and the second chip package 200B may be coupled to each other without distortion.

A negative (−) electrode of the light-emitting device chip 140A of the first chip package 200A is connected to a negative (−) electrode of the light-emitting device chip 140B of the second chip package 200B, and a positive (+) electrode of the light-emitting device chip 140A of the first chip package 200A is connected to a positive (+) electrode of the light-emitting device chip 140B of the second chip package 200B. Thus, like in FIG. 4, the package module has a structure in which the first chip package 200A and the second chip package 200B are connected in parallel to each other.

Figure 12:
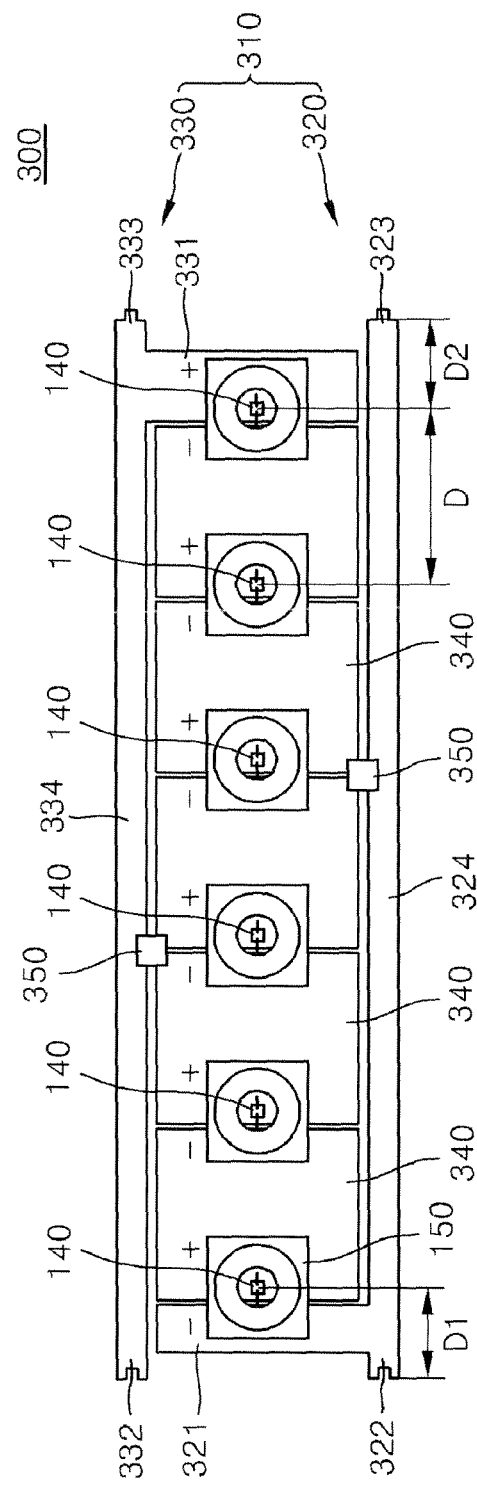
FIG. 12 is a schematic plan view of a chip package according to another embodiment of the present invention.
Figure 13:
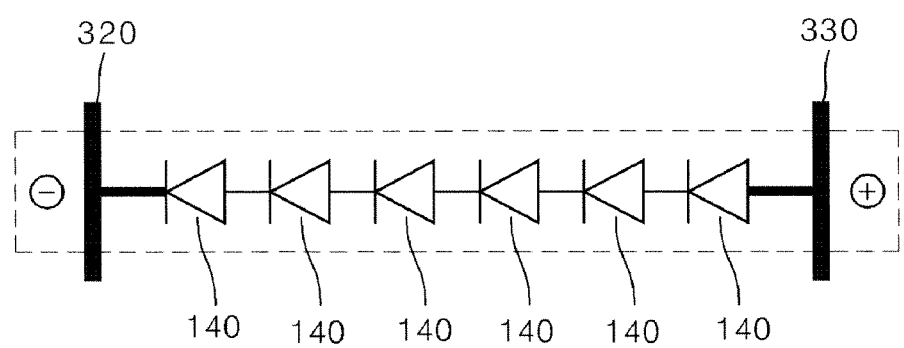
FIG. 13 is a circuit diagram of the chip package of FIG. 12.

FIG. 12 is a schematic plan view of a chip package 300 according to another embodiment of the present invention. FIG. 13 is a circuit diagram of the chip package 300 of FIG. 12.

Referring to FIG. 12, the chip package 300 includes a plurality of light-emitting device chips 140, a lead frame 310 for electrically connecting the light-emitting device chips 140 to an external device, coupling members 350 for fixing portions of the lead frame 310, and the reflective cavity 150 for reflecting light emitted from the light-emitting device chips 140 to guide the light outwards.

The lead frame 310 includes a first frame portion 320, a second frame portion 330, and intermediate connection portions 340 that are separately formed from each other. The first frame portion 320, the second frame portion 330, and the intermediate connection portions 340 are fixed by the coupling members 350 formed of an insulating resin, and the reflective cavity 150.

The first frame portion 320 includes a first connection portion 321, a first front terminal 322, a first rear terminal 323, and a first extension portion 324. The first connection portion 321 is connected to a negative (−) electrode of the foremost light-emitting device chip 140 of the light-emitting device chips 140 that are arranged in a line. The first front terminal 322 extends the first connection portion 321 towards a front end of the chip package 300, and the first rear terminal 323 extends from the first connection portion 321 towards a rear end of the chip package 300. The first extension portion 324 connecting the first connection portion 321 and the first rear terminal 323 to each other is spaced apart from the intermediate connection portions 340 by a predetermined distance along one side of an arrangement line of the light-emitting device chips 140.

The second frame portion 330 includes a second connection portion 331, a second front terminal 332, a second rear terminal 333, and a second extension portion 334. The second connection portion 331 is connected to a positive (+) electrode of the rearmost light-emitting device chip 140 of the light-emitting device chips 140 that are arranged in a line. The second front terminal 332 extends from the second connection portion 331 towards the front end of the chip package 300, and the second rear terminal 333 extends from the second connection portion 331 to the rear end of the chip package 300. The second extension portion 334 connecting the second connection portion 331 and the second front terminal 332 to each other is spaced apart from the intermediate connection portions 340 by a predetermined distance along the other one side of the arrangement line of the light-emitting device chips 140.

The first front terminal 322 and the second front terminal 332 are formed at the front end of the chip package 300, and function as a negative (−) terminal and a positive (+) terminal, respectively. The first rear terminal 323 and the second rear terminal 333 are formed at the rear end of the chip package 300, and function as a negative (−) terminal and a positive (+) terminal, respectively. In this case, the first and second front terminals 322 and 332, and the first and second rear terminals 323 and 333 constitute an end portion of the chip package 300. Each of the first front terminal 122 and the second front end terminal 132 includes a first coupling portion, and each of the first rear terminal 123 and the second rear terminal 133 includes a second coupling portion. For example, the first coupling portion and the second coupling portion have concave and convex shapes so as to be coupled to each other.

The intermediate connection portions 340 is disposed between the first connection portion 321 and the second connection portion 331. The light-emitting device chips 140 are arranged in a line, and thus the first connection portion 321, the intermediate connection portions 340, and the second connection portion 331 are also arranged in a line. Thus, an overall shape of the chip package 300 may be a bar shape.

The intermediate connection portions 340 are disposed between the light-emitting device chips 140 so as to connect positive (+) and negative (−) electrodes of the light-emitting device chips 140 to each other. There is one less intermediate connection portion 340 than light-emitting device chips 140. For example, as shown in FIG. 12, when the number of the light-emitting device chips 140 is six, the number of the intermediate connection portions 340 is five. The intermediate connection portions 340 together with the first connection portion 321 and the second connection portion 331 are used to connect the light-emitting device chips 140 in series to each other. The light-emitting device chips 140 may be indicated by a circuit diagram of FIG. 13.

The light-emitting device chips 140 may emit light beams with a single color or different colors. For example, when the chip package 300 is used as a white illumination apparatus, the light-emitting device chips 140 may be blue LED chips, or color rendering properties may be increased by using blue and red LED chips. A Zener diode chip (not shown) may also be mounted in order to protect the light-emitting device chips 140. In this case, the Zener diode chip may be mounted on every light-emitting device chip 140 or may be selectively mounted on some of the light-emitting device chips 140. Furthermore, a plurality of light-emitting device chips 140 or a single light-emitting device chip 140 may be installed in a single reflective cavity 150. When the plurality of the light-emitting device chips 140 are installed in the single reflective cavity 150, the plurality of the light-emitting device chips 140 may be connected to each other in a wafer level, or may be bonded to the lead frame 310 and then may be connected in parallel and/or series to each other by using various known methods.

According to the present embodiment, the number of the light-emitting device chips 140 is six, but the present embodiment is not limited thereto. The number of the light-emitting device chips 140 may be appropriately determined according to the power of an illumination apparatus using the chip package 300. According to the present embodiment, since the lead frame 310 has repeated patterns formed along an arrangement line of the light-emitting device chips 140, the number of the intermediate connection portions 340 may be easily changed according to the required number of the light-emitting device chips 140.

A case where chip packages are connected to each other will be described with reference to FIGS. 14 and 15.

Figure 14:
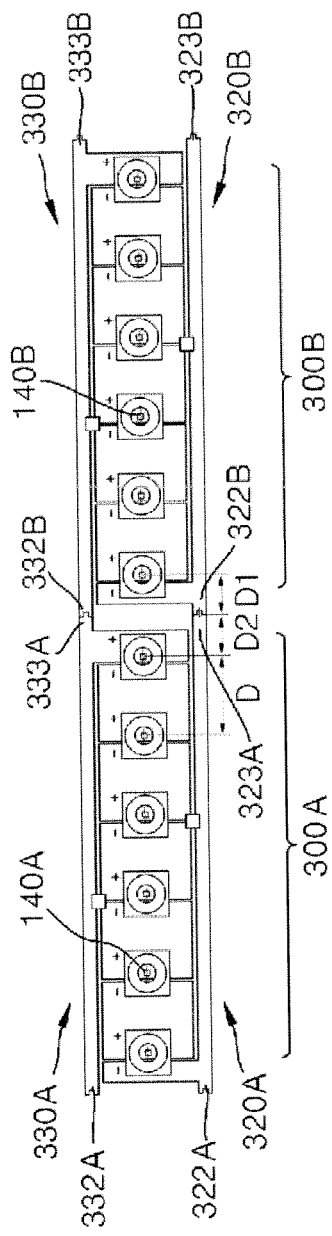
FIG. 14 is a plan view of a package module in which a first chip package and a second chip package are connected in parallel to each other, according to another embodiment of the present invention.
Figure 15:
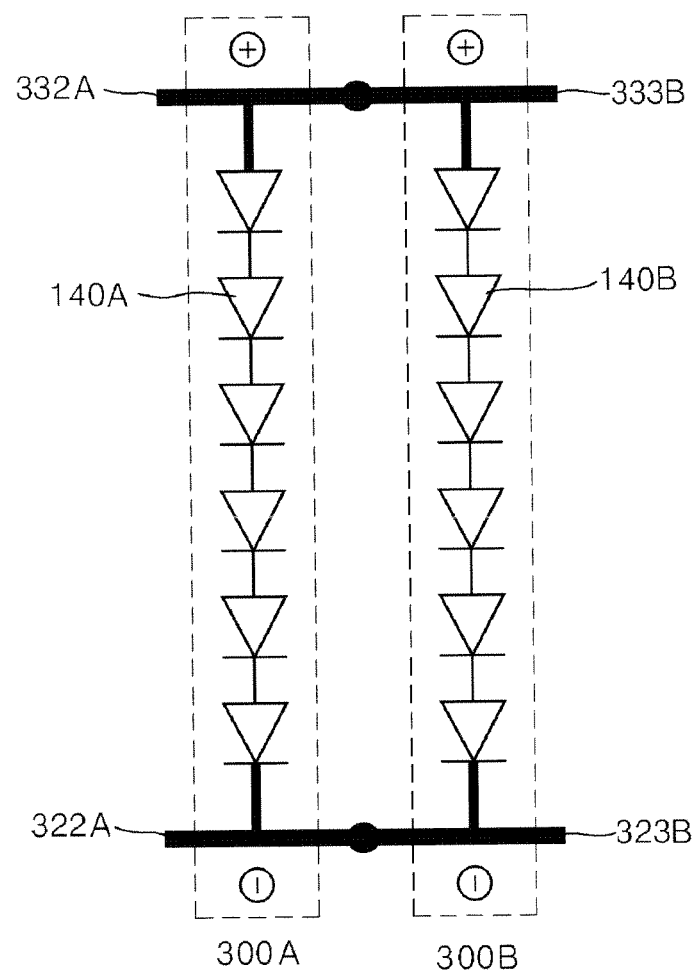
FIG. 15 is a circuit diagram of the package module of FIG. 14.

FIG. 14 is a plan view of a package module in which a first chip package 300A and a second chip package 300B are connected in parallel to each other, according to another embodiment of the present invention. FIG. 15 is a circuit diagram of the package module of FIG. 14.

The package module according to the present embodiment includes a first chip package 300A and a second chip package 300B. The first chip package 300A and the second chip package 300B are instrumentally and electrically connected to each other. Each of the first chip package 300A and the second chip package 300B corresponds to the chip package 300 described with reference to FIGS. 12 and 13.

As described with reference to FIGS. 12 and 13, since the first chip package 300A and the second chip package 300B include coupling portions formed on respective terminals, the first chip package 300A and the second chip package 300B may be directly connected to each other. A first rear terminal 323A of the first chip package 300A is coupled to a first front terminal 323B of the second chip package 300B, and a second rear terminal 333A of the first chip package 300A is coupled to a second front terminal 333B of the second chip package 300B. Thus, the first chip package 300A and the second chip package 300B are instrumentally and electrically connected to each other. In this case, the first rear terminal 323A of the first chip package 300A, and the first front terminal 323B of the second chip package 300B may each function as a negative (−) terminal, and the second rear terminal 333A of the first chip package 300A and the second front terminal 333B of the second chip package 300B may each function as a positive (+) electrode. Thus, the package module according to the present embodiment has a structure in which the first chip package 300A and the second chip package 300B are connected in parallel to each other, as shown in FIG. 15.

According to the present embodiment, the package module includes the first and second chip packages 300A and 300B that are connected. Alternatively, three or more chip packages may be consecutively connected so as to embody a line source that extends in a longitudinal direction.

Figure 16:
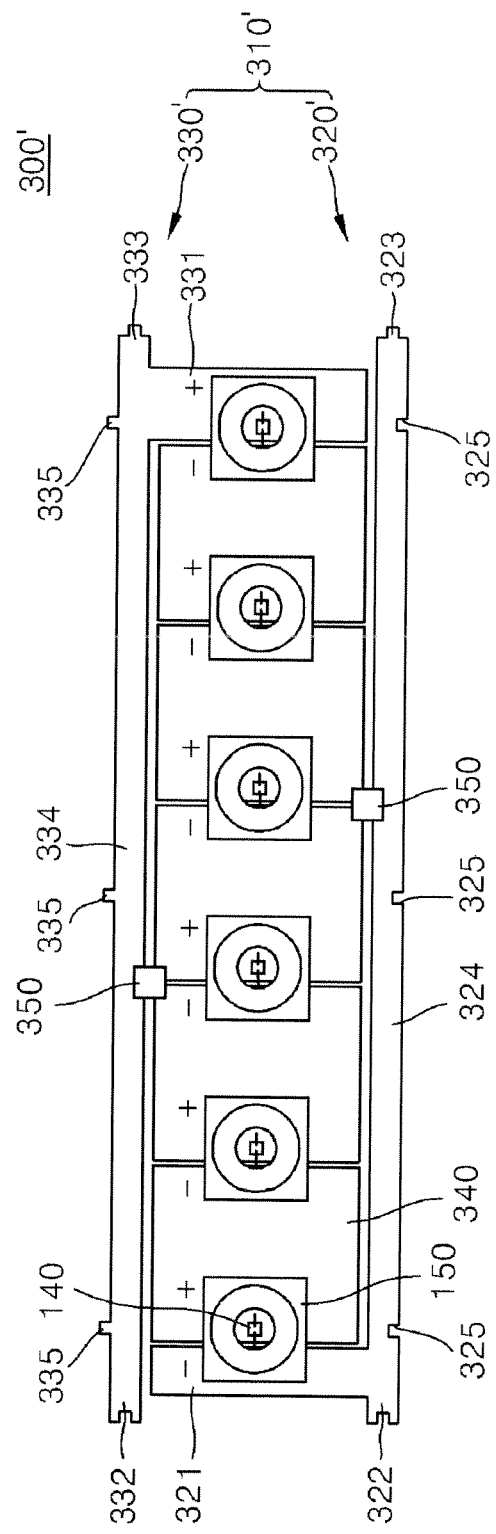
FIG. 16 is a schematic plan view of a chip package according to another embodiment of the present invention.
Figure 17:
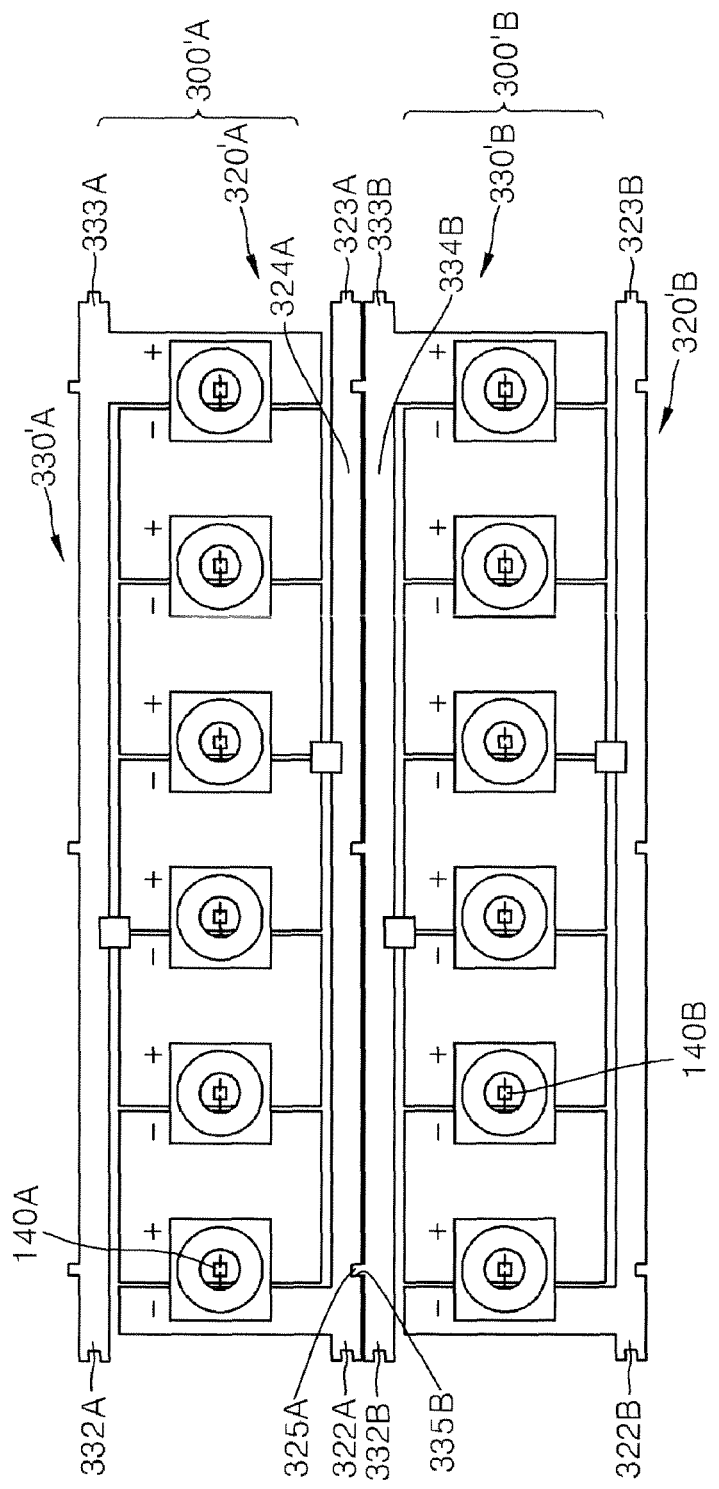
FIG. 17 is a schematic plan view of a package module in which chip packages are connected in series to each other, according to another embodiment of the present invention.
Figure 18:
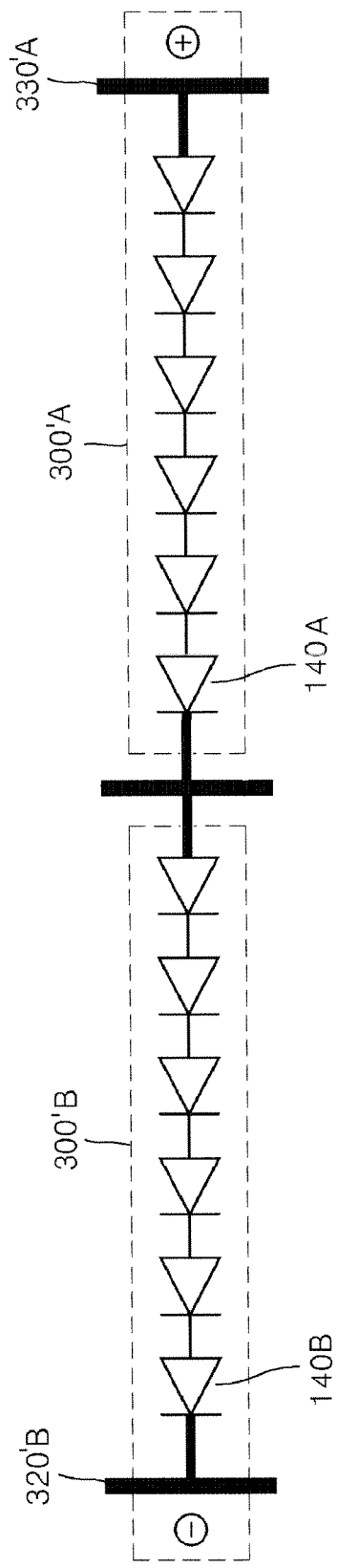
FIG. 18 is a circuit diagram of the package module of FIG. 17.

FIG. 16 is a schematic plan view of a chip package 300' according to another embodiment of the present invention. FIG. 17 is a schematic plan view of a package module in which chip packages are connected in series to each other, according to another embodiment of the present invention. FIG. 18 is a circuit diagram of the package module of FIG. 17.

The chip package 300' is configured by adding a separate coupling structure to the chip package 300 described with reference to FIG. 12. Referring to FIG. 16, the chip package 300' further includes a third coupling portion 325 formed at an edge of the first extension portion 324 of a first frame portion 320', and a fourth coupling portion 335 formed at an edge of the second extension portion 334 of a second frame portion 330'. The third coupling portion 325 and the fourth coupling portion 335 have complementary shapes so as to be coupled to each other. For example, as shown in FIG. 16, the third coupling portion 325 and the fourth coupling portion 335 may have a square concave shape and a square convex shape, or various complementary shapes.

Likewise, by forming the third coupling portion 325 and the fourth coupling portion 335 at edges of a bar-shaped lead frame 310', a first chip package 300'A and a second chip package 300'B are connected perpendicularly to a longitudinal direction of the bar-shaped lead frame 310', as shown in FIG. 17.

Referring to FIG. 17, the package module according to the present embodiment includes the first chip package 300'A and the second chip package 300'B. In addition, a third coupling portion 325A formed on a first extension portion 324A is coupled to a fourth coupling portion 325B formed on a second extension portion 324B of the second chip package 300'B, and thus the light-emitting device chips 140A and 140B may be arranged in a matrix so as to function as a surface illumination apparatus. A first extension portion 324 of the first chip package 300'A is electrically connected to the second extension portion 324B of the second chip package 300'B, and thus the first chip package 300'A and the second chip package 300'B are connected in series to each other, as shown in FIG. 18.

According to the present embodiment, the package module includes the first and second chip packages 300'A and 300'B that are connected in a longitudinal direction. Alternatively, three or more chip packages may be consecutively connected. In this case, some terminals of the chip packages, which contact each other, may be short-circuited, if necessary.

Figure 19:
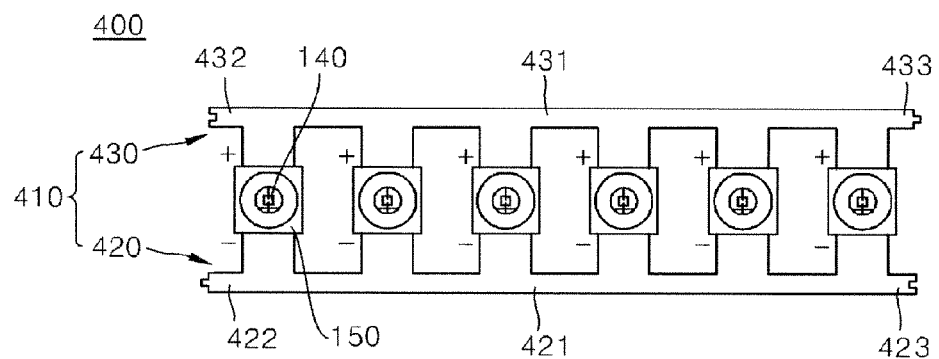
FIG. 19 is a schematic plan view of a chip package according to another embodiment of the present invention.
Figure 20:
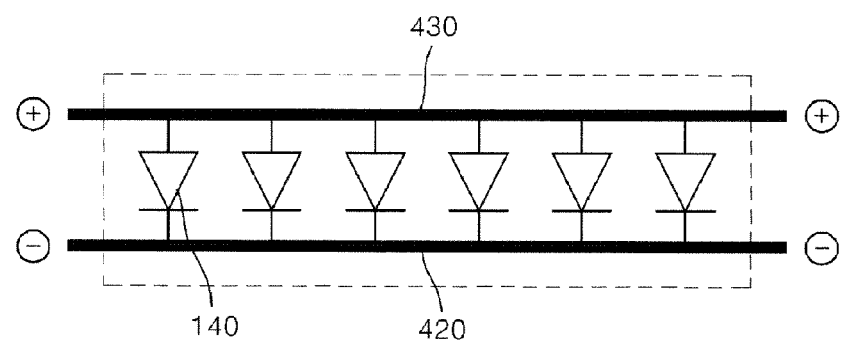
FIG. 20 is a circuit diagram of the chip package of FIG. 19.

FIG. 19 is a schematic plan view of a chip package 400 according to another embodiment of the present invention. FIG. 20 is a circuit diagram of the chip package 400 of FIG. 19.

The chip package 400 is formed by arranging the light-emitting device chips 140 in parallel to each other. Referring to FIGS. 19 and 20, the chip package 400 includes a lead frame 410, the light-emitting device chips 140, and the reflective cavity 150.

As shown in FIG. 19, the lead frame 410 includes a first frame portion 420 and a second frame portion 430, and has a long bar shape. Two ends of the first frame portion 420 extend to form a first front terminal 422 and a first rear terminal 423, and two ends of the second frame portion 430 extend to form a second front terminal 432 and a second rear terminal 433.

Like in FIG. 5A, the first front terminal 422 and the second front terminal 432 include a second convex coupling portion and a first concave coupling portion, respectively, and the first rear terminal 423 and the second rear terminal 433 include a first concave coupling portion and a second convex coupling portion.

The first frame portion 420 and the second frame portion 430 are spaced apart from each other by a predetermined distance, and any one of the first frame portion 420 and the second frame portion 430 includes a plurality of mounting portions (refer to the mounting portions 139 of FIG. 2). The light-emitting device chips 140 are mounted on the mounting portions, and electrical arrangement of the light-emitting device chips 140 is performed by using various known bonding methods such as a wire-bonding or flip-chip bonding method.

Positive (+) electrodes of the light-emitting device chips 140 are commonly and electrically connected to the first frame portion 420, and negative (−) electrodes of the light-emitting device chips 140 are commonly and electrically connected to the second frame portion 430. Thus, as shown in FIG. 15, the light-emitting device chips 140 are connected in parallel to each other by the first frame portion 420 and the second frame portion 430.

Figure 21:
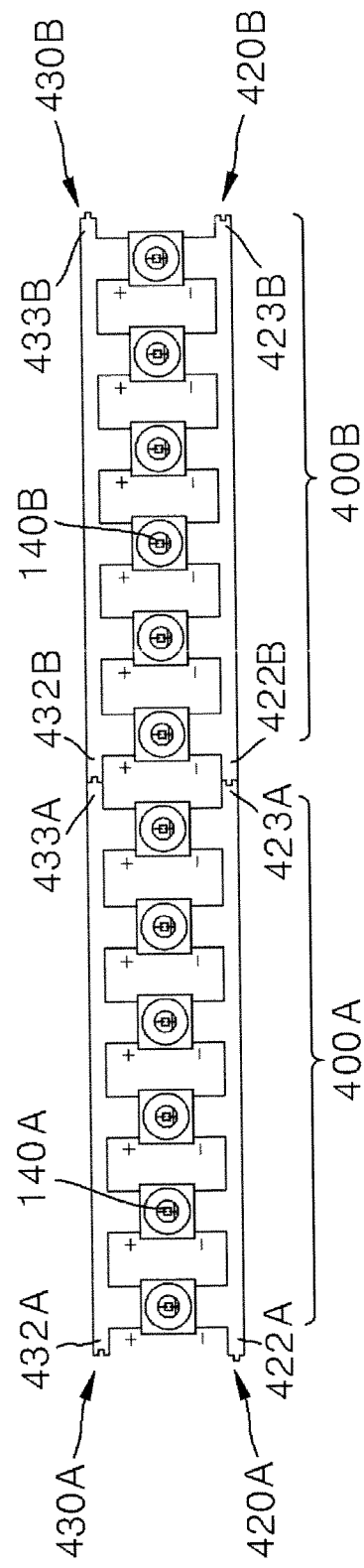
FIG. 21 illustrates a package module in which a first chip package and a second chip package are connected in parallel to each other, according to another embodiment of the present invention.
Figure 22:
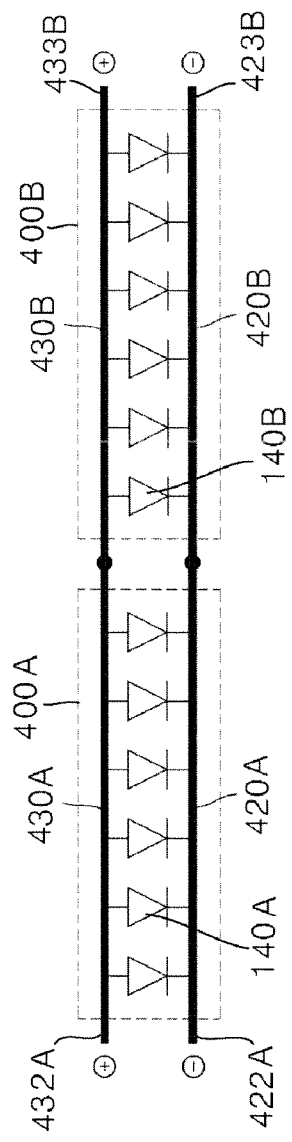
FIG. 22 is a circuit diagram of the package module of FIG. 21.

FIG. 21 illustrates a package module in which a first chip package 400A and a second chip package 400B are connected in parallel to each other, according to another embodiment of the present invention. FIG. 22 is a circuit diagram of the package module of FIG. 21.

Referring to FIG. 21, the package module according to the present embodiment includes the first chip package 400A and the second chip package 400B. The first chip package 400A and the second chip package 400B are instrumentally and electrically connected to each other. Each of the first chip package 400A and the second chip package 400B corresponds to the chip package 400 described with reference to FIGS. 19 and 20.

A first rear terminal 423A of the first chip package 400A is coupled to a first front terminal 423B of the second chip package 400B, and a second rear terminal 433A of the first chip package 400A is coupled to a second front terminal 433B of the second chip package 400B. Thus, the first chip package 400A and the second chip package 400B are instrumentally and electrically connected to each other. In this case, the first rear terminal 423A of the first chip package 400A and the first front terminal 423B of the second chip package 400B may each function as a negative (−) electrode, and the second rear terminal 433A of the first chip package 400A and the second front terminal 433B of the second chip package 400B may each function as a positive (+) electrode. Thus, the package module according to the present embodiment includes a structure in which the first chip package 400A and the second chip package 400B are connected in parallel to each other, as shown in FIG. 22.

Figure 23:
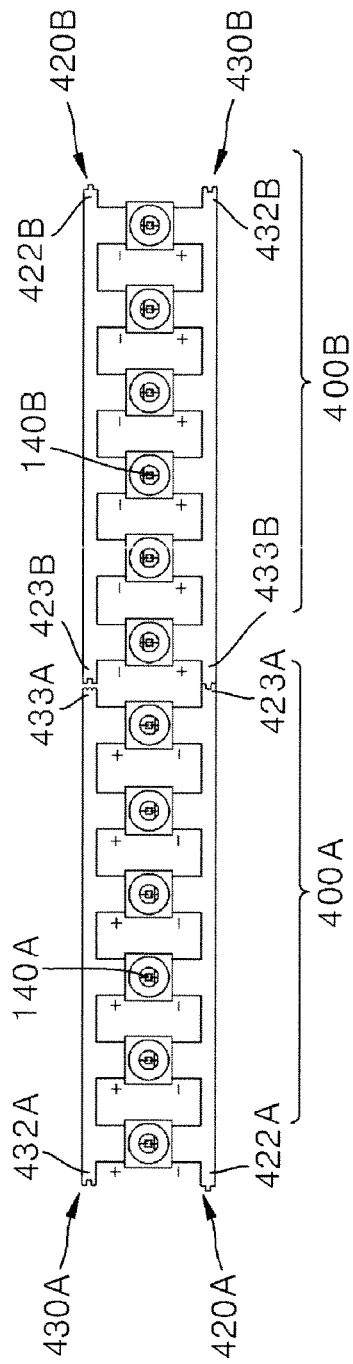
FIG. 23 is a plan view of a package module in which a first chip package and a second chip package are connected in series to each other, according to another embodiment of the present invention.
Figure 24:
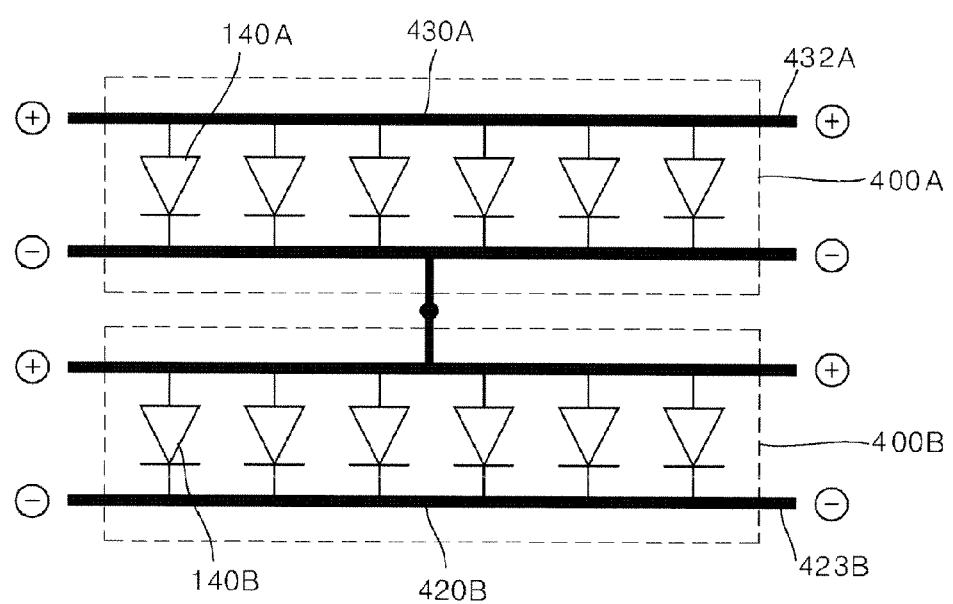
FIG. 24 is a circuit diagram of the package module of FIG. 23.

FIG. 23 is a plan view of a package module in which the first chip package 400A and the second chip package 400B are connected in series to each other, according to another embodiment of the present invention. FIG. 24 is a circuit diagram of the package module of FIG. 23.

Referring to FIG. 23, the package module according to the present embodiment includes the first chip package 400A and the second chip package 400B. Each of the first chip package 400A and the second chip package 400B corresponds to the chip package 400 described with reference to FIGS. 19 and 20.

The first rear terminal 423A of the first chip package 400A is coupled to a second rear terminal 433B of the second chip package 400B, and thus the first chip package 400A and the second chip package 400B are instrumentally and electrically connected to each other. In this case, at least one of the second rear terminal 433A of the first chip package 400A and a first rear terminal 422B of the second chip package 400B may be bent or removed so as to be short-circuited.

The first rear terminal 423A of the first chip package 400A is connected to negative (−) electrodes of the light-emitting device chips 140A, but the second rear terminal 433B of the second chip package 400B is connected to positive (+) electrodes of the light-emitting device chips 140B. Thus, the light-emitting device chips 140A of the first chip package 400A and the light-emitting device chips 140B of the second chip package 400B are connected in series to each other.

Figure 25:
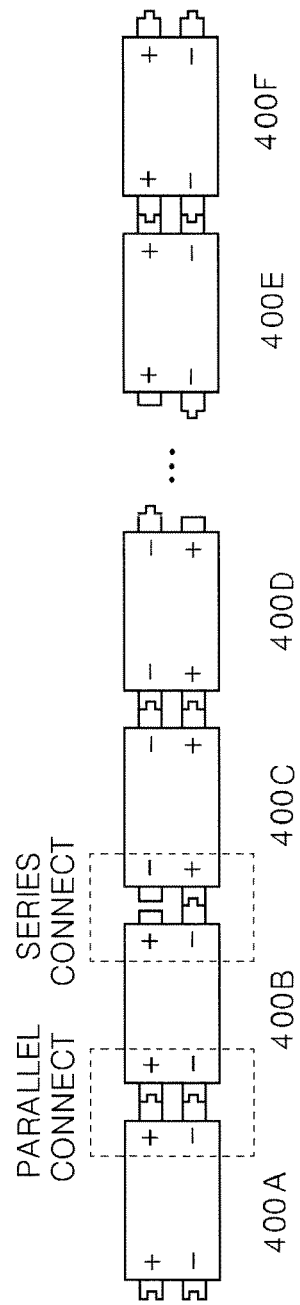
FIG. 25 is a structural diagram of a package module in which chip packages are connected in a combination of parallel and series to each other, according to another embodiment of the present invention.
Figure 26:
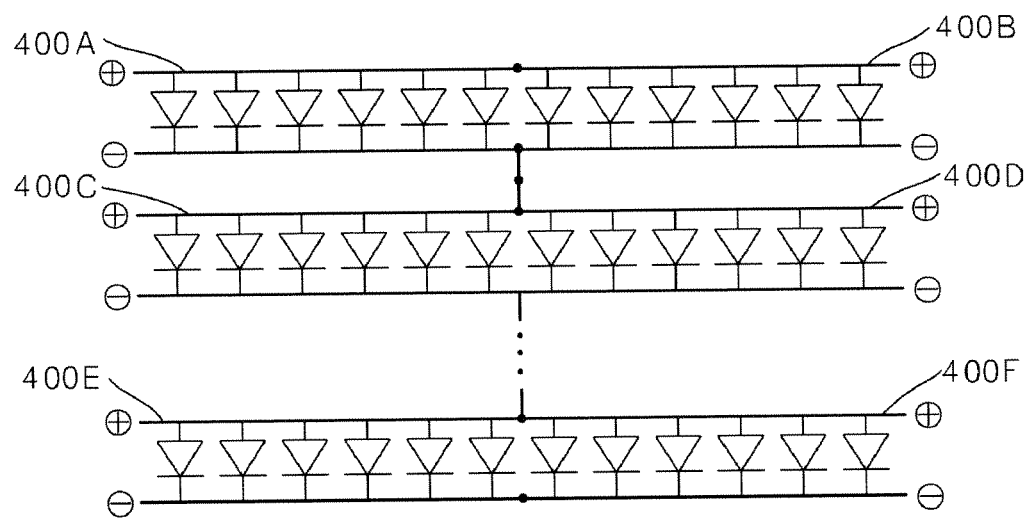
FIG. 26 is a circuit diagram of the package module of FIG. 25.

FIG. 25 is a structural diagram of a package module in which chip packages are connected in a combination of parallel and series to each other, according to another embodiment of the present invention. FIG. 26 is a circuit diagram of the package module of FIG. 25.

Referring to FIGS. 25 and 26, the package module according to the present embodiment includes chip packages 400A, 400B, 400C, 400D, 400E and 400F that are connected in a combination of parallel (see FIG. 21) and series (see FIG. 23). For example, when the chip packages 400A, 400B, 400C, 400D, 400E and 400F are obtained by connecting six light-emitting device chips 140 in parallel to each other, each pair of the chip packages (400A and 400B), (400C and 400D), and (400E and 400F) may be connected in parallel, as shown in FIG. 21, and the chip packages (400A and 400B), (400C and 400D), and (400E and 400F) may be connected in series to each other, as shown in FIG. 23. In this case, the number of the chip packages may be a multiple of six.

Figure 27:
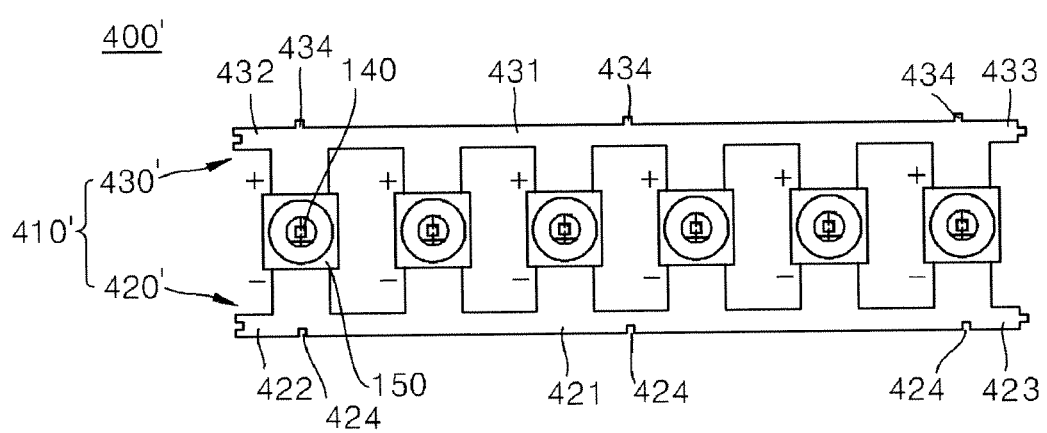
FIG. 27 is a schematic plan view of a chip package according to another embodiment of the present invention.
Figure 28:
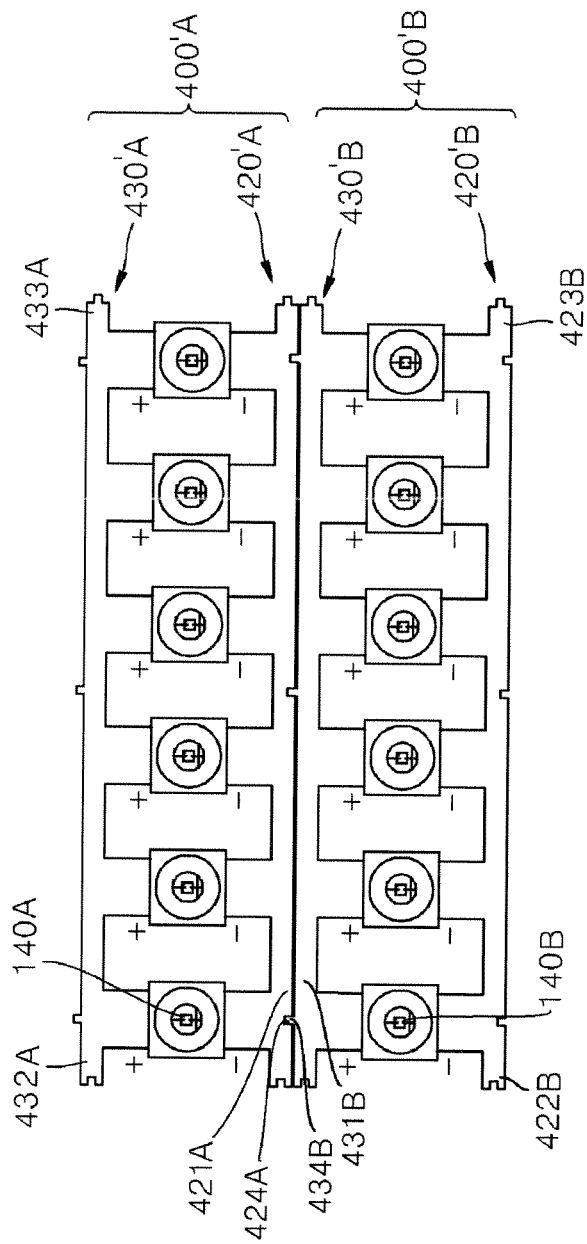
FIG. 28 is a plan view of a package module in which a first chip package and a second chip package are connected in series to each other, according to another embodiment of the present invention.
Figure 29:
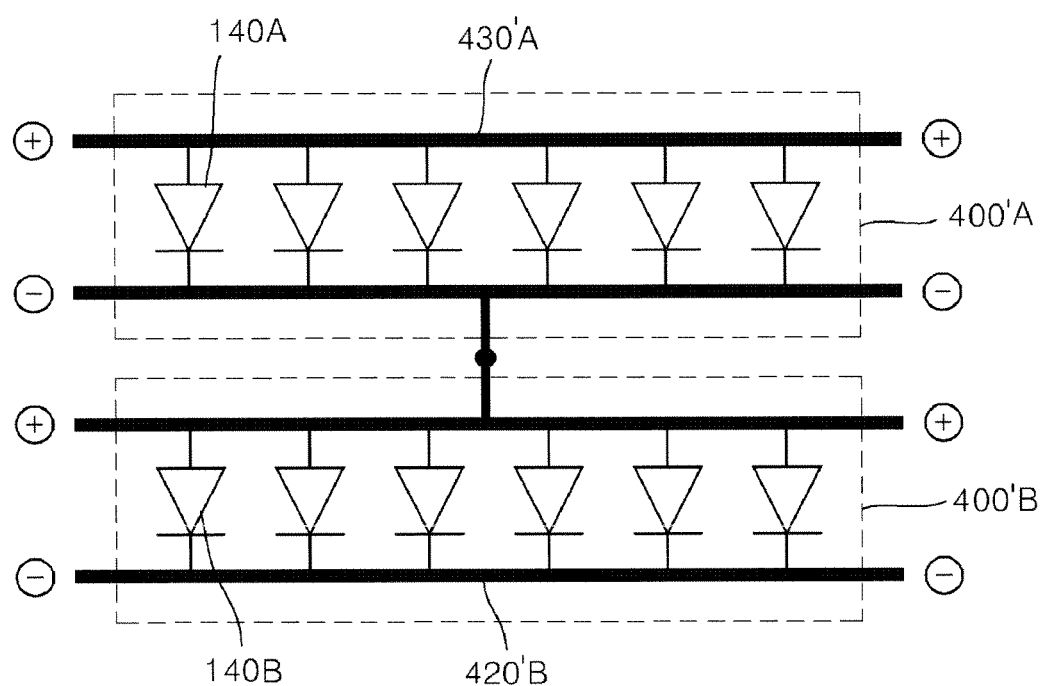
FIG. 29 is a circuit diagram of the package module of FIG. 28.

FIG. 27 is a schematic plan view of a chip package 400' according to another embodiment of the present invention. FIG. 28 is a plan view of a package module in which a first chip package 400'A and a second chip package 400'B are connected in series to each other, according to another embodiment of the present invention. FIG. 29 is a circuit diagram of the package module of FIG. 28.

The chip package 400' is formed by adding a separate coupling structure to the chip package 400 described with reference to FIG. 19. Referring to FIG. 27, the chip package 400' further includes a third coupling portion 424 formed at an edge of a first connection portion 421 of a first frame portion 420', and a fourth coupling portion 434 formed at an edge of a second connection portion 431 of a second frame portion 430'. The third coupling portion 424 and the fourth coupling portion 434 have complementary shapes so as to be coupled to each other. For example, as shown in FIG. 27, the third coupling portion 424 and the fourth coupling portion 434 may have a square concave shape and a square convex shape, or various complementary shapes.

Likewise, by forming the third coupling portion 424 and the fourth coupling portion 434 at edges of a bar-shaped lead frame 410', the chip package 400' are connected perpendicularly to a longitudinal direction of the bar-shaped lead frame 410', as shown in FIG. 28.

Referring to FIG. 28, the package module according to the present embodiment includes a first chip package 400'A and a second chip package 400'B. In addition, a third coupling portion 424A formed on a first connection portion 421A of the first chip package 400'A is coupled to a fourth coupling portion 434B formed on a second connection portion 431B of the second chip package 400'B, and thus the light-emitting device chips 140A and 140B may be arranged in a matrix so as to function as a surface illumination apparatus. The first connection portion 421A of the first chip package 400'A is electrically connected to a second connection portion 431B of the second chip package 400'B, and thus the first chip package 400'A and the second chip package 400'B are connected in series to each other, as shown in FIG. 29.

FIGS. 30A through 30G are diagrams for explaining a method of manufacturing the chip package 300, according to an embodiment of the present invention. FIGS. 31A through 31C illustrate the lead frame 310 on a sheet-by-sheet basis, during the manufacture of the chip package 300. The chip package 300 shown in FIGS. 30A through 30G and 31A through 31C corresponds to the chip package 300 described with reference to FIG. 12.

Figure 30A:
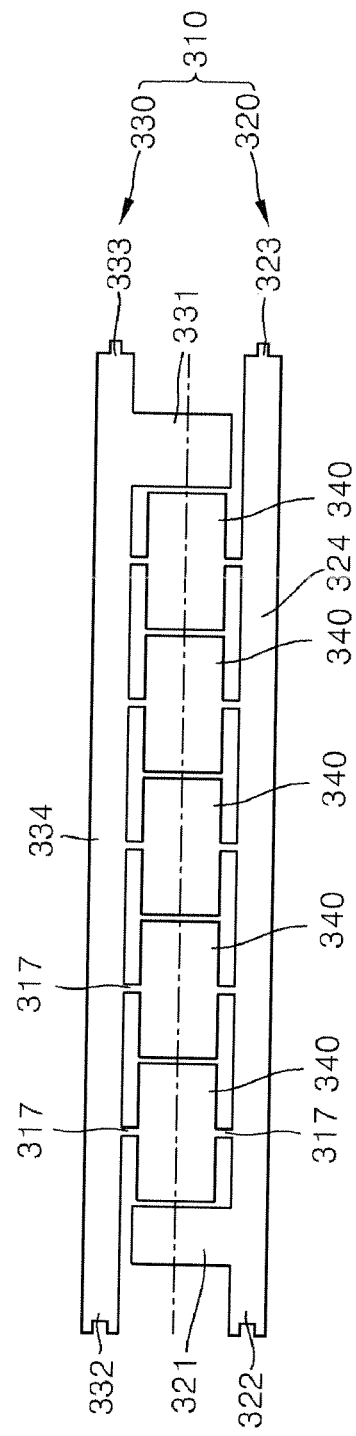
FIGS. 30A through 30G are diagrams for explaining a method of manufacturing a chip package, according to an embodiment of the present invention.
Figure 30B:
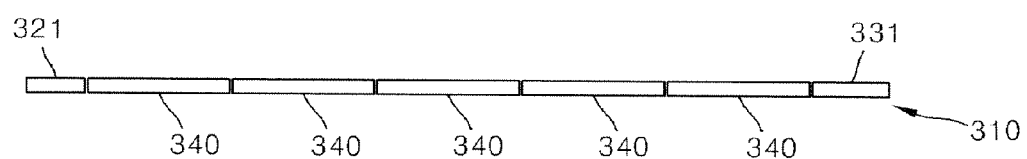
Figure 31A:
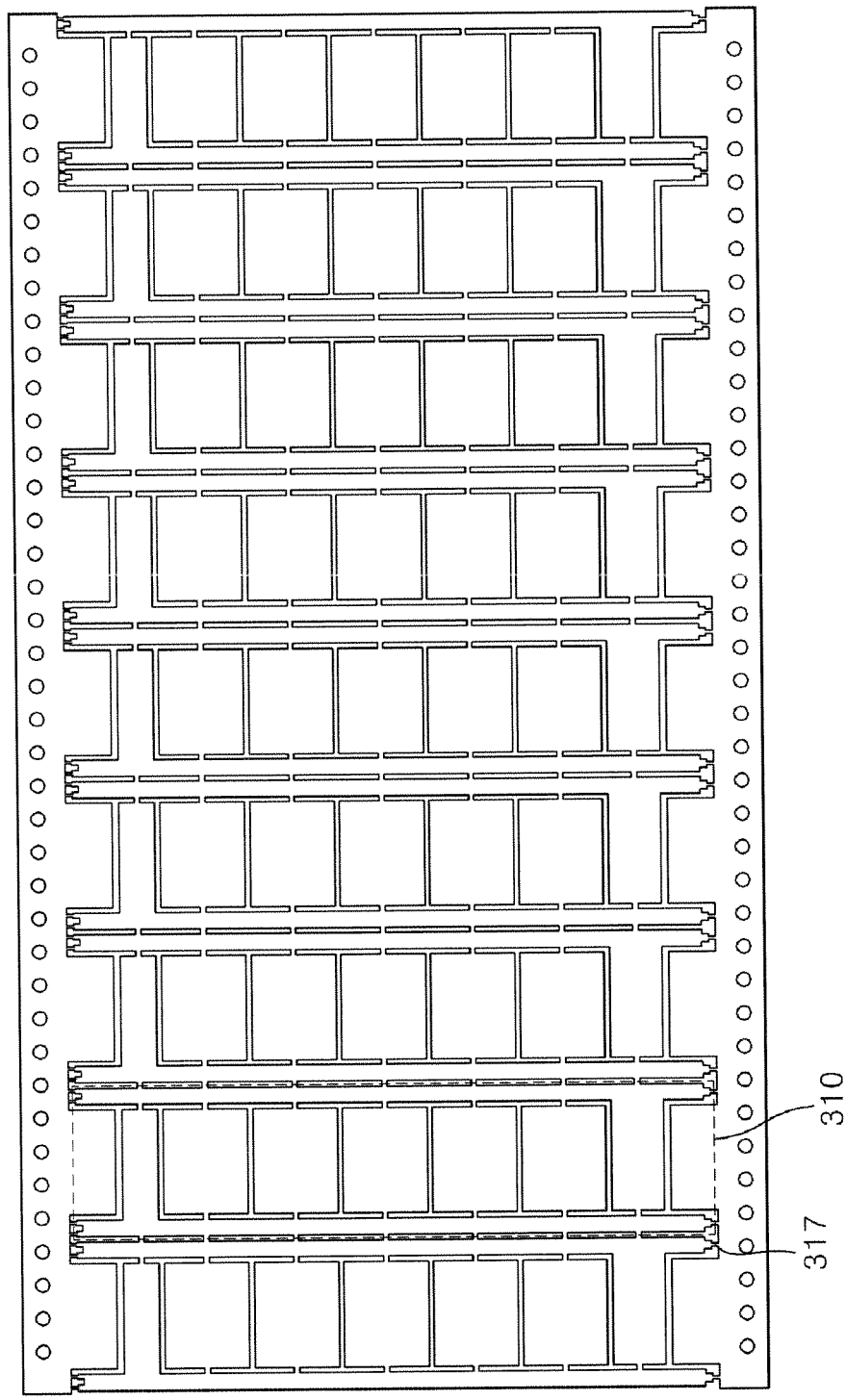
FIGS. 31A through 31C illustrate a lead frame on a sheet-by-sheet basis, during the manufacture of the chip package.
Figure 31B:
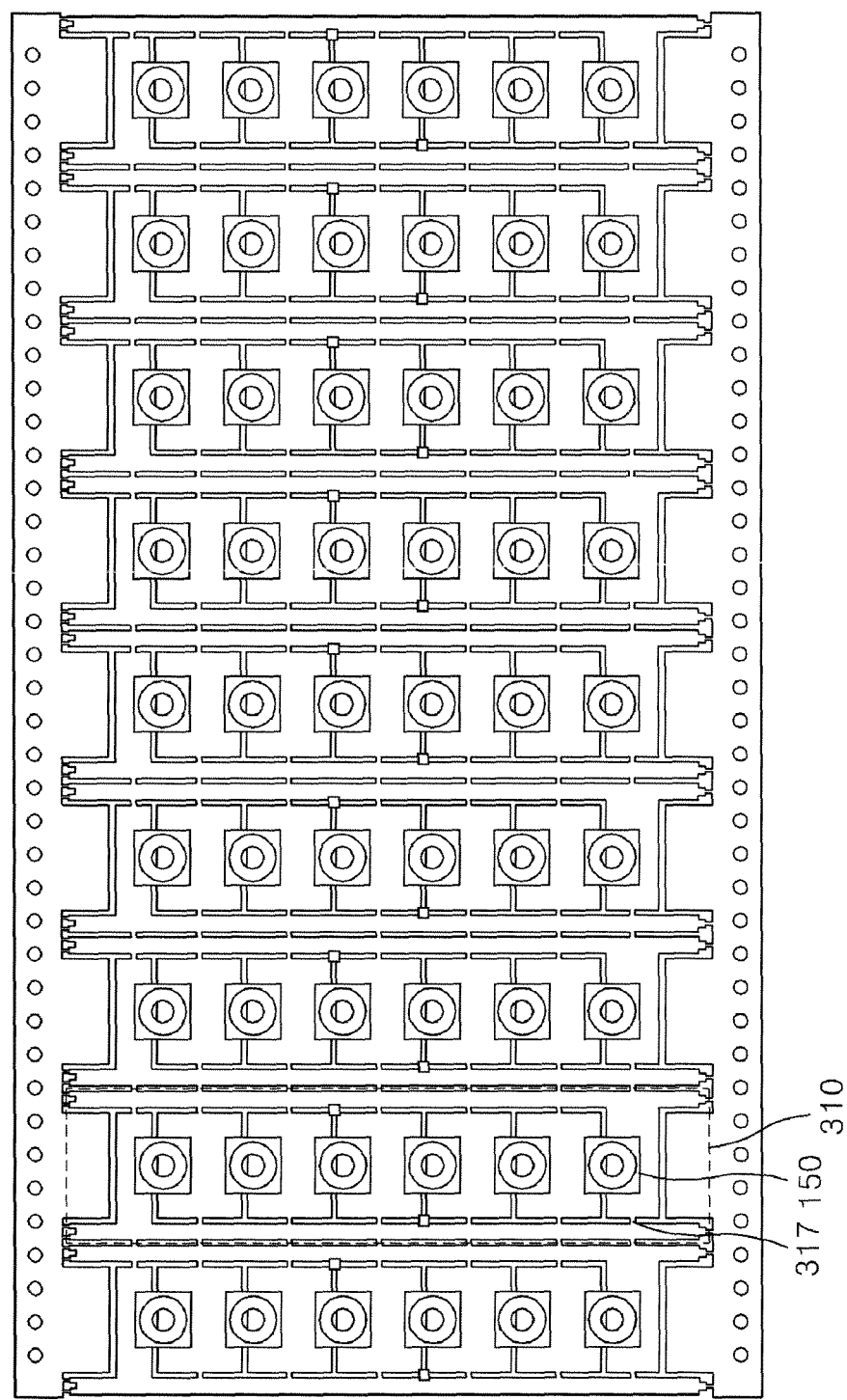
Figure 31C:
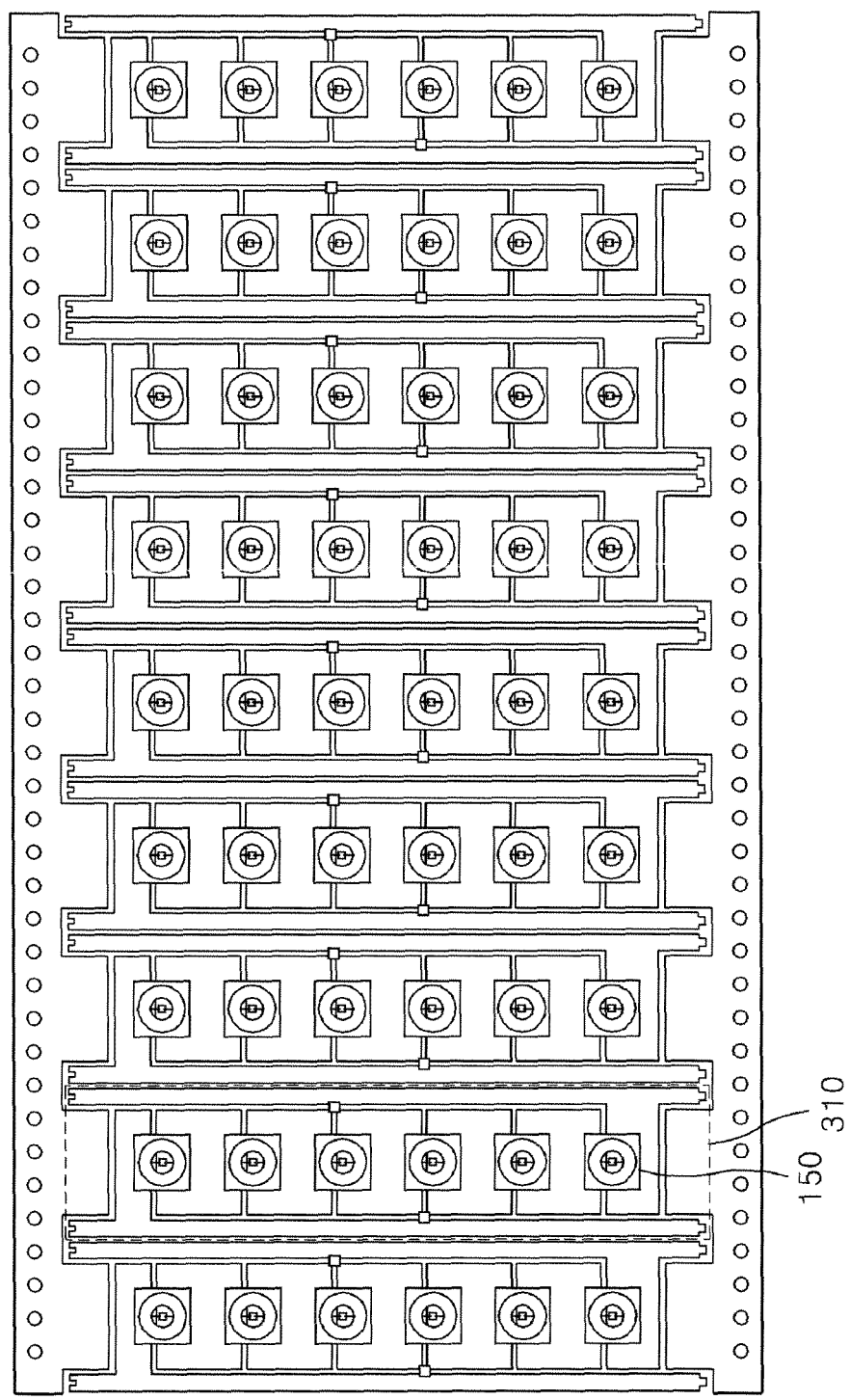

First, referring to FIGS. 30A and 30B, the lead frame 310 is prepared. FIG. 30A is a plan view of the lead frame 310. FIG. 30B is a cross-sectional view of the lead frame 310. A material or thickness of the lead frame 310 may be known to one of ordinary skill in the art. For example, the lead frame 310 may be formed of metal such as aluminum (Al), or copper (Cu) with a sub-millimeter thickness, and may have a pattern formed by using a press process, an etching process, or the like. In the current operation, the lead frame 310 is supported by the first frame portion 320, and the second frame portion 330. In addition, the intermediate connection portions 340 are connected and supported by cleavage portions 317. The first front terminal 322 and the first rear terminal 323 that are respectively formed on ends of the first frame portion 320 include coupling structures having complementary shapes, respectively, as shown in FIG. 30A. In addition, the second front terminal 332 and the second rear terminal 333 that are respectively formed on ends of the second frame portion 330 include coupling structures having complementary shapes, respectively, as shown in FIG. 30A.

In FIGS. 30A and 30B, the lead frame 310 is included in a single chip package. A single lead frame 310 may have a plurality of patterns, as shown in FIG. 31A. The coupling structure having complementary shapes of ends of the lead frame 310 may be simultaneously formed when the patterns of the lead frame 310 are formed.

Figure 30C:
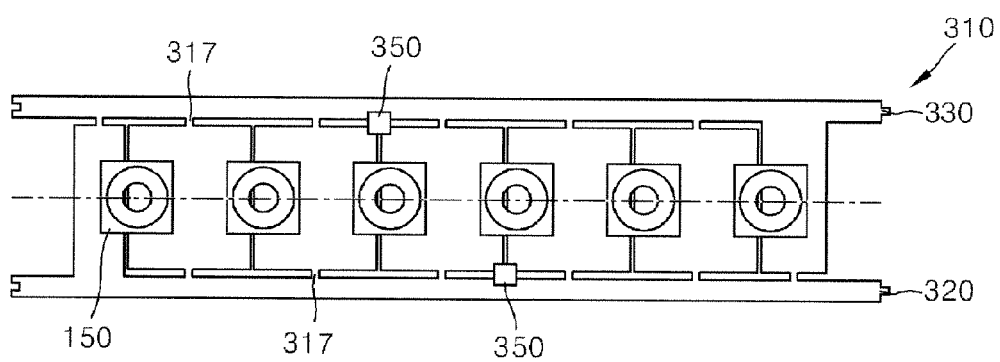
Figure 30D:
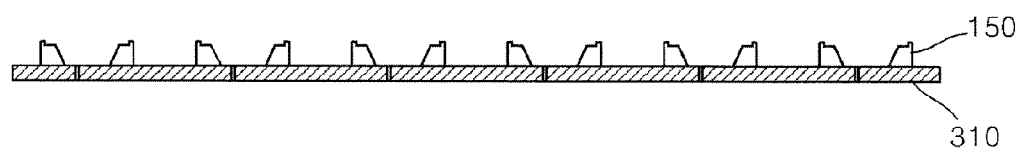

Then, as shown in FIGS. 30C and 30D, the reflective cavity 150 is formed on the lead frame 310. The reflective cavity 150 may be formed of an epoxy resin, a silicon resin, plastic, or the like by using an injection molding method. If the coupling structure having complementary shapes of the ends of the lead frame 310 is a protrusion and coupling groove set, the protrusion may be simultaneously formed when the reflective cavity 150 is formed by using an injection molding method. When the reflective cavity 150 is formed, the coupling members 350 for fixing the first frame portion 320 and the intermediate connection portions 340, and the second frame portion 330 and the intermediate connection portions 340 to each other may be simultaneously formed. If necessary, as shown in FIG. 7, the reflective cavity 150 may extend, and the coupling members 350 may be omitted. The reflective cavity 150 and the coupling members 350 may be formed on a sheet-by-sheet basis of the lead frame 310, as shown in FIG. 31B.

Figure 30E:
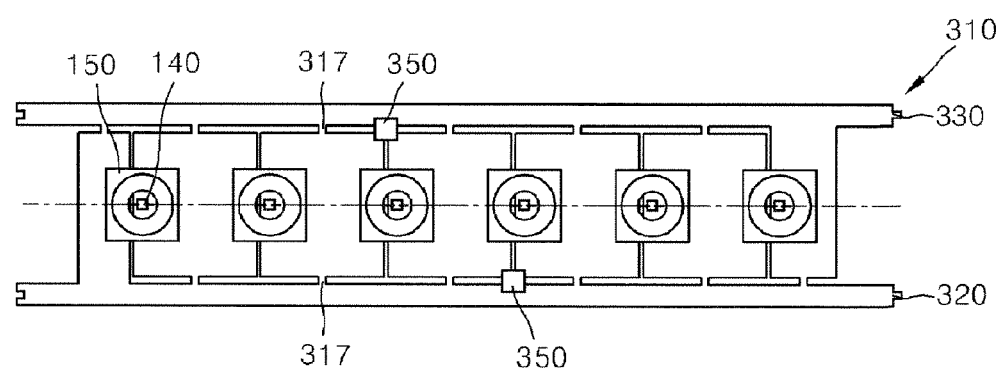
Figure 30F:
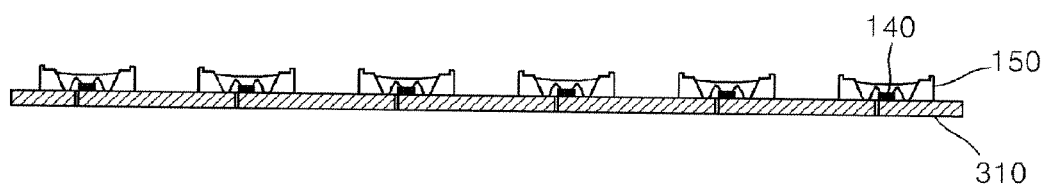

Then, as shown in FIGS. 30E and 30F, the light-emitting device chips 140 are mounted on the lead frame 310. The light-emitting device chips 140 may be formed on the mounting portion 139 (see FIG. 2) by using a die attaching method. Then, wires are used to electrically arrange the light-emitting device chips 140, and a transparent resin is filled inside the reflective cavity 150. If necessary, a lens may be added.

Figure 30G:
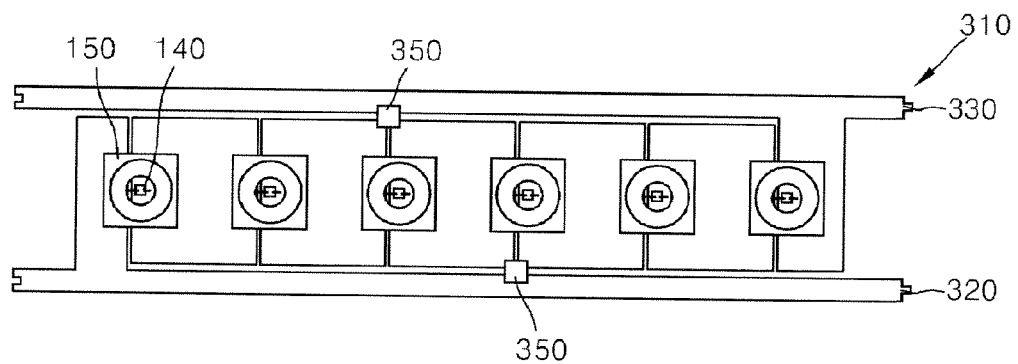

Then, as shown in FIG. 30G, the cleavage portions 317 of the lead frame 310 are removed to separate lead frames 310 from each other, thereby completing the manufacture of the chip package 300. FIG. 31C shows the lead frames 310 when the cleavage portions 317 are removed.

If necessary, after the light-emitting device chips 140 are mounted on the mounting portion 139, before the transparent resin is filled inside the reflective cavity 150, the cleavage portions 317 of the chip package 300 may be immediately removed. When the cleavage portions 317 are removed, the light-emitting device chips 140 are electrically connected. Thus, the light-emitting device chips 140 are powered on, electric arrangement states or light-emitting states of the light-emitting device chips 140 may be tested. In this case, the chip packages 300 may be attached to each other in the lead frames 310 by using known methods (e.g., a tie bar).

Figure 32:
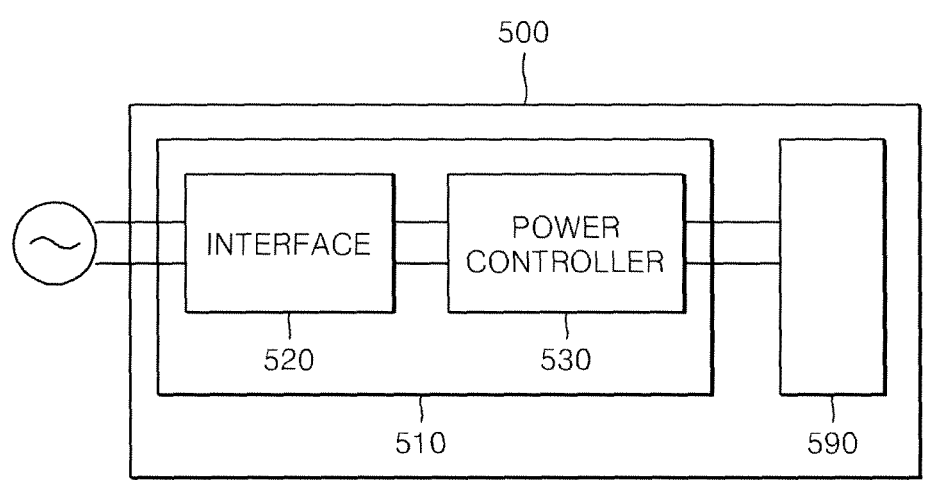
FIG. 32 is a structural diagram of an illumination apparatus including a chip package, according to an embodiment of the present invention

FIG. 32 is a structural diagram of an illumination apparatus 500 including a chip package, according to an embodiment of the present invention.

Referring to FIG. 32, the illumination apparatus 500 includes an illumination module 590, and a power supplying unit 510 for supplying power to the illumination module 590.

The illumination module 590 may use the chip packages or the package module, described with reference to FIGS. 1 through 15.

The power supplying unit 510 may include an interface 520 for receiving power, and a power controller 530 for controlling the power supplied to the illumination module 590. The interface 520 may include a fuse for shutting-off an excess current, and an electromagnetic wave shielding filter for preventing electromagnetic interference. The power may be supplied from an external source, or a battery included in the illumination apparatus 500. When an alternative current (AC) power is input as the power, the power controller 530 may further a rectifying portion for converting alternative current (AC) to direct current (DC), and a static voltage controller for converting a voltage to a voltage that is appropriate to the illumination module 590. If a power source is a DC source (e.g., a battery) having an appropriate voltage to the illumination module 590, the rectifying portion or the static controller may be omitted. In addition, when an AC-LED is used as a light-emitting device chip of the illumination module 590, AC power may be supplied directly to the illumination module 590. In this case, the rectifying portion or the static controller may also be omitted. Furthermore, the illumination module 590 controls a color temperature, or the like so as to realize illumination according to a user's emotion.

Various types of the illumination apparatus 500 may be used by using a light source. For example, as described above, a package module including chip packages that are connected in a longitudinal direction may be used as a linear light source. The package modules are connected in parallel to each other in a longitudinal direction so as to embody a surface illumination apparatus, or the chip packages may be connected in longitudinal and width directions so as to embody a surface illumination apparatus.

For example, the illumination apparatus 500 may be a general illumination apparatus replacing a general electric bulb or fluorescent lamp, an illumination apparatus used in a vehicle, a vessel or an aircraft, or an illumination apparatus for emitting light with a predetermined wavelength, used in a home appliance product such as a refrigerator, a television, a washer, etc. For example, when the illumination apparatus 500 is used as a general illumination apparatus replacing a general electric bulb or fluorescent lamp, a plurality of light-emitting device chips are included in a single chip package, and thus an amount of light may be increased. In addition, color rendering properties may be increased by disposing light-emitting device chips such as a blue light-emitting device chip and a red light-emitting device chip. A phosphor is used in a light-emitting device chip to emit blue, red and green light beams, and thus an emotionally compatible apparatus may be realized so as to realize colors that are appropriate for indoor and outdoor environments.

The illumination apparatus 500 may be a non-self light-emitting display panel such as a liquid crystal display (LCD) panel, or a backlight unit of a large-scaled billboard.

For example, an etch-type backlight unit is configured by a linear light source at a side of a guiding plate, and thus the linear light source used in the etch-type backlight unit may be used in a package module in which chip packages are connected in a longitudinal direction, as described in the previous embodiments.

In addition, a direct-light type backlight unit uses a surface light source. Thus, a package module in which chip packages are connected in parallel to each other in a longitudinal direction may function as a surface light source. Alternatively, a package module in which chip packages are connected in longitudinal and width directions may be used a surface light source. In addition, these package modules are arranged so as to function as a surface light source.

The illumination module 590 uses a plurality of light-emitting device chips in order to ensure a sufficient amount of light. With regard to a general illumination module, primary packaging is performed on light-emitting device chips (e.g., LED chips) together with a phosphor and a lens on a lead frame. The light-emitting device chips on which the primary packaging is performed are connected in parallel and/or in series, and secondary packaging is performed so that the light-emitting device chips are mounted on a printed circuit board (PCB). However, according to the present embodiment, the illumination apparatus 500 uses a chip package in which a plurality of light-emitting device chips are connected in parallel and/or in series on a lead frame, and packaging is performed. In addition, chip packages may be coupled directed to each other according to capacity of the illumination apparatus 500 or a space for installing the illumination apparatus 500, and may be immediately used as an illumination module. When an LED for replacing inexpensive light sources such as a fluorescent lamp is used as a new illumination apparatus, it is very important to reduce manufacturing costs. Thus, according to the present embodiment, the illumination apparatus 500 immediately constitutes a circuit of light-emitting device chips during a packaging operation, and simultaneously, chip packages are simply coupled to each other, thereby simplifying a packaging operation and reducing manufacturing costs.

So far, cases of light-emitting device chips have been described, but the embodiments of the present invention are not limited thereto. It will be understood by one of ordinary skill in the art that a general chip apart from a light-emitting chip device including two electrode structures includes at least two coupling portions that are formed on ends of a lead frame and are coupled to each other, and thus a plurality of chip packages are electrically and instrumentally connected.

As described above, according to the one or more of the above embodiments of the present invention, a structure of a lead frame is improved, and chip packages are connected directly to each other to constitute a module, thereby reducing manufacturing costs.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A lead frame for a chip package, the lead frame comprising:
    a mounting portion for mounting a chip thereon;
    a terminal portion for electrically connecting the chip to an external device; and
    a plurality of cleavage portions for connecting the mounting portion and the terminal portion to each other, wherein the cleavage portions are cut after the chip is mounted,
    wherein the terminal portion comprises a first shaping terminal comprising a first coupling portion, and a second shape terminal comprising a second coupling portion that is coupled to the first coupling portion.

2. The lead frame of claim 1, wherein the first coupling portion and the second coupling portion comprises concave and convex shapes so as to be coupled to each other.

3. The lead frame of claim 1, wherein the first coupling portion and the second coupling portion comprise a protrusion, and a coupling groove into which the protrusion is inserted, respectively.

4. The lead frame of claim 1, further comprising a plurality of mounting portions so as to mount a plurality of chips thereon.

5. The lead frame of claim 4, further comprising a plurality of connection portions for electrically connecting the plurality of chips.

6. The lead frame of claim 5, wherein each of the plurality of connection portions comprises:
    at least one intermediate connection portion for connecting the chips in series to each other;
    a first connection portion that is electrically connected to a first electrode of a foremost chip of the plurality of chips; and
    a second connection portion that is electrically connected to a second electrode of a rearmost chip of the plurality of chips,
    wherein the terminal portion comprises a first terminal that extends from the first connection portion, and a second terminal that extends from the second connection portion.

7. The lead frame of claim 6, wherein the first connection portion, the intermediate portion, and the second connection portion are arranged in a line,
    wherein the first terminal comprises a first front terminal that is disposed at a front side of the plurality of connection portions, and a first rear terminal that is disposed at a rear side of the plurality of connection portions, and
    wherein the second terminal comprises a second front terminal that is disposed at a front side of the plurality of connection portions, and a second rear terminal that is disposed at a rear side of the plurality of connection portions.

8. The lead frame of claim 7, wherein the first front terminal and the first rear terminal comprise a first shape terminal and a second shape terminal, respectively, and
    wherein the second front terminal and the second rear terminal comprises a first shape terminal and a second shape terminal, respectively.

9. The lead frame of claim 7, wherein the first front terminal and the first rear terminal comprise a first shape terminal and a second shape terminal, respectively, and wherein the second front terminal and the second rear terminal comprises a second shape terminal and a first shape terminal, respectively.

10. The lead frame of claim 5, wherein each of the plurality of connection portions comprises a first connection portion for electrically connecting first electrodes of the plurality of chips, and a second connection portion for electrically connecting second electrodes of the plurality of chips so that the plurality of chips are connected in parallel to each other.

11. A chip package comprising:
a chip; and
a lead frame comprising a mounting portion for mounting the chip thereon, and a terminal portion for electrically connecting the chip to an external device,
wherein the terminal portion comprises a first shaping terminal comprising a first coupling portion, and a second shape terminal comprising a second coupling portion that is coupled to the first coupling portion.

12. The chip package of claim 11, wherein the first coupling portion and the second coupling portion comprises concave and convex shapes so as to be coupled to each other.

13. The chip package of claim 11, wherein the first coupling portion and the second coupling portion comprise a protrusion, and a coupling groove into which the protrusion is inserted, respectively.

14. The chip package of claim 13, wherein any one of the first shape terminal and the second shape terminal is stepped by a thickness of the lead frame.

15. The chip package of claim 11, wherein the chip comprises a plurality of light-emitting device chips,
wherein the chip package further comprises a plurality of mounting portions so as to mount a plurality of chips thereon, and
wherein the lead frame comprises a plurality of connection portions for electrically connecting the plurality of light-emitting device chips.

16. The chip package of claim 15, wherein each of the plurality of connection portions comprises:
at least one intermediate connection portion for connecting the light-emitting device chips in series to each other;
a first connection portion that is electrically connected to a first electrode of a foremost chip of the plurality of light-emitting device chips; and
a second connection portion that is electrically connected to a second electrode of a rearmost chip of the plurality of light-emitting device chips,
wherein the terminal portion comprises a first terminal that extends from the first connection portion, and a second terminal that extends from the second connection portion.

17. The chip package of claim 16, wherein the plurality of light-emitting device chips are arranged in a line.

18. The chip package of claim 17, wherein the first terminal comprises a first front terminal that is disposed at a front side of the plurality of connection portions, and a first rear terminal that is disposed at a rear side of the plurality of connection portions,
wherein the second terminal comprises a second front terminal that is disposed at a front side of the plurality of connection portions, and a second rear terminal that is disposed at a rear side of the plurality of connection portions, and
wherein the connection portion comprises a first extension portion that extends from the first connection portion to the first rear terminal along one side of an arrangement line of the plurality of light-emitting device chips, and a second extension portion that extends from the second connection portion to the second front terminal along the other side of the arrangement line of the plurality of light-emitting device chips.

19. The chip package of claim 18, wherein the first front terminal and the first rear terminal comprise a first shape terminal and a second shape terminal, respectively, and
wherein the second front terminal and the second rear terminal comprises a first shape terminal and a second shape terminal, respectively.

20. The chip package of claim 18, wherein the first front terminal and the first rear terminal comprise a first shape terminal and a second shape terminal, respectively, and
wherein the second front terminal and the second rear terminal comprises a second shape terminal and a first shape terminal, respectively.

21. The chip package of claim 18, further comprising a third coupling portion formed at an edge of the first extension portion, and at least one fourth coupling portion that is formed at an edge of the second extension portion so as to be coupled to the at least one third coupling portion.

22. The chip package of claim 18, wherein the first extension portion and the second extension portion are each coupled to the at least one intermediate connection portion by a coupling member formed of an insulating material.

23. The chip package of claim 21, wherein the coupling member extends beyond edges of at least portions of the first extension portion and the second extension portion.

24. The chip package of claim 23, wherein the coupling member is integrated with a reflective cavity for reflecting light emitted from the light-emitting device chip.

25. The chip package of claim 16, further comprising a reflective cavity for reflecting light emitted from the light-emitting device chip,
wherein the reflective cavity couples the first connection portion, the intermediate connection portion, and the second connection portion to each other.

26. The chip package of claim 15, wherein the plurality of connection portions comprises a first connection portion for electrically connecting first electrodes of the plurality of chips, and a second connection portion for electrically connecting second electrodes of the plurality of chips so that the plurality of chips are connected in parallel to each other, and
wherein the terminal portion comprises a first terminal that extends from the first connection portion, and a second terminal that extends from the second terminal.

27. The chip package of claim 26, wherein the plurality of light-emitting device chips are arranged in a line.

28. The chip package of claim 27, wherein the first terminal comprises a first front terminal that is disposed at a front side of the plurality of connection portions, and a first rear terminal that is disposed at a rear side of the plurality of connection portions, and
wherein the second terminal comprises a second front terminal that is disposed at a front side of the plurality of connection portions, and a second rear terminal that is disposed at a rear side of the plurality of connection portions.

29. The chip package of claim 28, wherein the first front terminal and the first rear terminal comprise a first shape terminal and a second shape terminal, respectively, and
wherein the second front terminal and the second rear terminal comprises a first shape terminal and a second shape terminal, respectively.

30. The chip package of claim 28, wherein the first front terminal and the first rear terminal comprise a first shape terminal and a second shape terminal, respectively, and wherein the second front terminal and the second rear terminal comprise a second shape terminal and a first shape terminal, respectively.

31. The chip package of claim 28, further comprising a third coupling portion formed at an edge of the first connection portion, and at least one fourth coupling portion that is formed at an edge of the second connection portion so as to be coupled to the at least one third coupling portion.

32. The chip package of claim 28, wherein the first connection portion, the intermediate connection portion, and the second connection portion are coupled to each other by a coupling member formed of an insulating material.

33. The chip package of claim 28, further comprising a reflective cavity for reflecting light emitted from the light-emitting device chip,
wherein the reflective cavity couples the first connection portion, the intermediate connection portion, and the second connection portion to each other.

34. The chip package of claim 15, wherein the plurality of mounting portions are disposed on some of the plurality of connection portions.

35. The chip package of claim 15, wherein the plurality of mounting portions are disposed between the plurality of connection portions, and
wherein the plurality of mounting portions and the plurality of connection portions are coupled to each other by a coupling member formed of an insulating material.

36. The chip package of claim 35, wherein the plurality of mounting portions are formed of a thermal conductive material.

37. The chip package of claim 15, wherein the plurality of light-emitting device chips are connected to the plurality of connection portions by using a wire-bonding method.

38. The chip package of claim 15, wherein the plurality of light-emitting device chips are connected to the plurality of connection portions by using a flip-chip bonding method.

39. The chip package of claim 15, further comprising a reflective cavity for reflecting light emitted from the plurality of light-emitting device chips.

40. The chip package of claim 39, further comprising a lens for refracting light emitted from the plurality of light-emitting device chips.

41. The chip package of claim 15, wherein each of the plurality of light-emitting device chips is a GaN-based light-emitting diode chip, and
wherein the plurality of light-emitting device chips are coated by a transmissive resin comprising a phosphor.

42. A package module comprising a first chip package and a second chip package, wherein each of the first chip package and the second chip package comprises: a chip; and a lead frame comprising a mounting portion for mounting the chip thereon, and a terminal portion for electrically connecting the chip to an external device,
wherein the terminal portion comprises a first shaping terminal comprising a first coupling portion, and a second shape terminal comprising a second coupling portion that is coupled to the first coupling portion,
wherein a first shape terminal of the first chip package and a second shape terminal of the second chip package are electrically connected to each other so as to be coupled to each other.

43. The package module of claim 42, wherein the first coupling portion and the second coupling portion comprises concave and convex shapes so as to be coupled to each other.

44. The package module of claim 42, wherein the first coupling portion and the second coupling portion comprise a protrusion, and a coupling groove into which the protrusion is inserted, respectively.

45. The package module of claim 42, wherein the chip comprises a plurality of light-emitting device chips,
wherein the chip package further comprises a plurality of mounting portions so as to mount a plurality of chips thereon, and
wherein the lead frame comprises a plurality of connection portions for electrically connecting the plurality of light-emitting device chips.

46. The package module of claim 45, wherein each of the plurality of connection portions comprises:
at least one intermediate connection portion for connecting the light-emitting device chips in series to each other;
a first connection portion that is electrically connected to a first electrode of a foremost chip of the plurality of light-emitting device chips; and
a second connection portion that is electrically connected to a second electrode of a rearmost chip of the plurality of light-emitting device chips,
wherein the terminal portion comprises a first terminal that extends from the first connection portion, and a second terminal that extends from the second connection portion.

47. The package module of claim 46, wherein the plurality of light-emitting device chips are arranged in a line,
wherein the first terminal comprises a first front terminal that is disposed at a front side of the plurality of connection portions, and a first rear terminal that is disposed at a rear side of the plurality of connection portions,
wherein the second terminal comprises a second front terminal that is disposed at a front side of the plurality of connection portions, and a second rear terminal that is disposed at a rear side of the plurality of connection portions, and
wherein the connection portion comprises a first extension portion that extends from the first connection portion to the first rear terminal along one side of an arrangement line of the plurality of light-emitting device chips, and a second extension portion that extends from the second connection portion to the second front terminal along the other side of the arrangement line of the plurality of light-emitting device chips.

48. The package module of claim 47, wherein the first front terminal and the first rear terminal comprise a first shape terminal and a second shape terminal, respectively, and
wherein the second front terminal and the second rear terminal comprise a first shape terminal and a second shape terminal, respectively,
wherein the first rear terminal of the first chip package and the first front terminal of the second chip package are electrically connected to each other so as to be coupled to each other,
wherein the second rear terminal of the first chip package and the second front terminal of the second package are electrically connected to each other so as to be coupled to each other, and
wherein the first chip package and the second chip package are connected in a line along which the plurality of light-emitting device chips are arranged.

49. The package module of claim 47, wherein the first front terminal and the first rear terminal comprise a first shape terminal and a second shape terminal, respectively, and wherein the second front terminal and the second rear terminal comprises a second shape terminal and a first shape terminal, respectively, wherein the first rear terminal of the first chip package and the first front terminal of the second chip package are electrically connected to each other so as to be coupled to each other, wherein the second rear terminal of the first chip package and the second front terminal of the second package are electrically connected to each other so as to be coupled to each other, and wherein the first chip package and the second chip package are connected in a line along which the plurality of light-emitting device chips are arranged.

50. The package module of claim 47, further comprising a third coupling portion formed at an edge of the first extension portion, and at least one fourth coupling portion that is formed at an edge of the second extension portion so as to be coupled to the at least one third coupling portion, wherein the at least one fourth coupling portion of the first chip package and the at least one third coupling portion of the second chip package are electrically connected to each other so as to be coupled to each other, and wherein the first chip package and the second chip package are perpendicularly connected in a line along which the plurality of light-emitting device chips are arranged.

51. The package module of claim 45, wherein the plurality of connection portions comprises a first connection portion for electrically connecting first electrodes of the plurality of chips, and a second connection portion for electrically connecting second electrodes of the plurality of chips so that the plurality of chips are connected in parallel to each other, and wherein the terminal portion comprises a first terminal that extends from the first connection portion, and a second terminal that extends from the second terminal.

52. The package module of claim 51, wherein the plurality of light-emitting device chips are arranged in a line, wherein the first terminal comprises a first front terminal that is disposed at a front side of the plurality of connection portions, and a first rear terminal that is disposed at a rear side of the plurality of connection portions, and wherein the second terminal comprises a second front terminal that is disposed at a front side of the plurality of connection portions, and a second rear terminal that is disposed at a rear side of the plurality of connection portions.

53. The package module of claim 52, wherein the first front terminal and the first rear terminal comprise a first shape terminal and a second shape terminal, respectively, and wherein the second front terminal and the second rear terminal comprises a first shape terminal and a second shape terminal, respectively, wherein the first rear terminal of the first chip package and the first front terminal of the second chip package are electrically connected to each other so as to be coupled to each other, wherein the second rear terminal of the first chip package and the second front terminal of the second package are electrically connected to each other so as to be coupled to each other, and wherein the first chip package and the second chip package are connected in a line along which the plurality of light-emitting device chips are arranged.

54. The package module of claim 52, wherein the first front terminal and the first rear terminal comprise a first shape terminal and a second shape terminal, respectively, and wherein the second front terminal and the second rear terminal comprise a second shape terminal and a first shape terminal, respectively, wherein the first rear terminal of the first chip package and the first front terminal of the second chip package are electrically connected to each other so as to be coupled to each other, wherein the second rear terminal of the first chip package and the second front terminal of the second package are electrically connected to each other so as to be coupled to each other, and wherein the first chip package and the second chip package are connected in a line along which the plurality of light-emitting device chips are arranged.

55. The package module of claim 52, further comprising a third coupling portion formed at an edge of the first extension portion, and at least one fourth coupling portion that is formed at an edge of the second extension portion so as to be coupled to the at least one third coupling portion, wherein the at least one fourth coupling portion of the first chip package and the at least one third coupling portion of the second chip package are electrically connected to each other so as to be coupled to each other, and wherein the first chip package and the second chip package are perpendicularly connected in a line along which the plurality of light-emitting device chips are arranged.

56. An illumination apparatus comprising:

a package module comprising a first chip package and a second chip package; and a power supplying unit for supplying power to the package module, wherein each of the first chip package and the second chip package comprises a chip, and a lead frame comprising a mounting portion for mounting the chip thereon, and a terminal portion for electrically connecting the chip to an external device, wherein the terminal portion comprises a first shaping terminal comprising a first coupling portion, and a second shape terminal comprising a second coupling portion that is coupled to the first coupling portion, wherein a first shape terminal of the first chip package and a second shape terminal of the second chip package are electrically connected to each other so as to be coupled to each other.

57. The illumination apparatus of claim 56, wherein the first coupling portion and the second coupling portion comprises concave and convex shapes so as to be coupled to each other.

58. The illumination apparatus of claim 56, wherein the first coupling portion and the second coupling portion comprise a protrusion, and a coupling groove into which the protrusion is inserted, respectively.

59. The illumination apparatus of claim 56, wherein the chip comprises a plurality of light-emitting device chips, wherein the chip package further comprises a plurality of mounting portions so as to mount a plurality of chips thereon, and wherein the lead frame comprises a plurality of connection portions for electrically connecting the plurality of light-emitting device chips.

60. The illumination apparatus of claim 56, wherein the power supplying unit comprises:

an interface for receiving power; and a power controller for controlling power supplied to the illumination module.

61. The illumination apparatus of claim 56, wherein the package module comprises a backlight unit for emitting light to a non-self light-emitting display apparatus.

* * * * *